United States Patent
Setta

(10) Patent No.: US 9,853,052 B1
(45) Date of Patent: Dec. 26, 2017

(54) SEMICONDUCTOR DEVICE AND METHOD FOR MANUFACTURING SAME

(71) Applicant: TOSHIBA MEMORY CORPORATION, Minato-ku (JP)

(72) Inventor: Yuji Setta, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/410,909

(22) Filed: Jan. 20, 2017

Related U.S. Application Data

(60) Provisional application No. 62/395,842, filed on Sep. 16, 2016.

(51) Int. Cl.

| | | |
|---|---|---|
| *H01L 27/11582* | (2017.01) | |
| *H01L 27/11519* | (2017.01) | |
| *H01L 27/11521* | (2017.01) | |
| *H01L 27/11526* | (2017.01) | |
| *H01L 27/11556* | (2017.01) | |
| *H01L 27/11565* | (2017.01) | |

(Continued)

(52) U.S. Cl.
CPC .... *H01L 27/11582* (2013.01); *H01L 21/0217* (2013.01); *H01L 21/02164* (2013.01); *H01L 21/28273* (2013.01); *H01L 21/28282* (2013.01); *H01L 27/11519* (2013.01); *H01L 27/11521* (2013.01); *H01L 27/11526* (2013.01); *H01L 27/11556* (2013.01); *H01L 27/11565* (2013.01); *H01L 27/11568* (2013.01); *H01L 27/11573* (2013.01)

(58) Field of Classification Search
CPC ......... H01L 27/11582; H01L 27/11565; H01L 27/11521; H01L 27/11526; H01L 27/11556; H01L 21/0217; H01L 27/11519; H01L 27/11573; H01L 21/28282; H01L 21/28273; H01L 21/02164; H01L 27/11568

See application file for complete search history.

(56) References Cited

U.S. PATENT DOCUMENTS 4,882,289 A 11/1989 Moriuchi et al.
6,023,099 A 2/2000 Komuro
(Continued)

FOREIGN PATENT DOCUMENTS

JP 8-21682 3/1996
JP 2923912 7/1999

*Primary Examiner* — William Coleman
(74) *Attorney, Agent, or Firm* — Oblon, McClelland, Maier & Neustadt, L.L.P.

(57) ABSTRACT

According to one embodiment, the circuit portion includes a transistor provided at a region separated from the first stacked portion in the substrate. The second stacked portion is provided above the circuit portion. The second stacked portion includes a plurality of first layers and a plurality of second layers. The first layers and the second layers include a first layer and a second layer stacked alternately. An insulating layer is provided above the circuit portion and provided above the substrate between the first stacked portion and the second stacked portion. A height of an uppermost first layer of the second stacked portion from a surface of the substrate is substantially equal to a height of an uppermost electrode layer of the first stacked portion from the surface of the substrate, or is higher than the height of the uppermost electrode layer.

11 Claims, 30 Drawing Sheets

(51) Int. Cl.
*H01L 27/11568* (2017.01)
*H01L 27/11573* (2017.01)
*H01L 21/28* (2006.01)
*H01L 21/02* (2006.01)

(56) References Cited

U.S. PATENT DOCUMENTS

| | | | | |
|---|---|---|---|---|
| 8,803,214 | B2 * | 8/2014 | Tang | H01L 27/0688 |
| | | | | 257/314 |
| 8,927,366 | B2 * | 1/2015 | Lee | H01L 27/11556 |
| | | | | 257/E21.04 |
| 9,530,697 | B1 * | 12/2016 | Nakaki | H01L 21/823487 |
| 2012/0064682 | A1 * | 3/2012 | Jang | H01L 21/28273 |
| | | | | 438/268 |
| 2012/0168858 | A1 * | 7/2012 | Hong | H01L 27/11573 |
| | | | | 257/330 |
| 2016/0118399 | A1 * | 4/2016 | Son | G11C 5/025 |
| | | | | 365/185.18 |
| 2017/0025423 | A1 | 1/2017 | Terada et al. | |
| 2017/0047341 | A1 * | 2/2017 | Arai | H01L 27/11582 |
| 2017/0069656 | A1 * | 3/2017 | Minami | H01L 27/11582 |
| 2017/0125538 | A1 * | 5/2017 | Sharangpani | H01L 29/4975 |

* cited by examiner

SEMICONDUCTOR DEVICE AND METHOD FOR MANUFACTURING SAME

CROSS-REFERENCE TO RELATED APPLICATION

This application is based upon and claims the benefit of priority from U.S. Provisional Patent Application 62/395,842, filed on Sep. 16, 2016; the entire contents of which are incorporated herein by reference.

FIELD

Embodiments described herein relate generally to a semiconductor device and a method for manufacturing a semiconductor device.

BACKGROUND

In a three-dimensional memory device, a difference in level between a region in which a cell array is formed and a peripheral circuit region may have an affect on an accuracy of a pattern formed by lithography.

DETAILED DESCRIPTION

Figure 1:
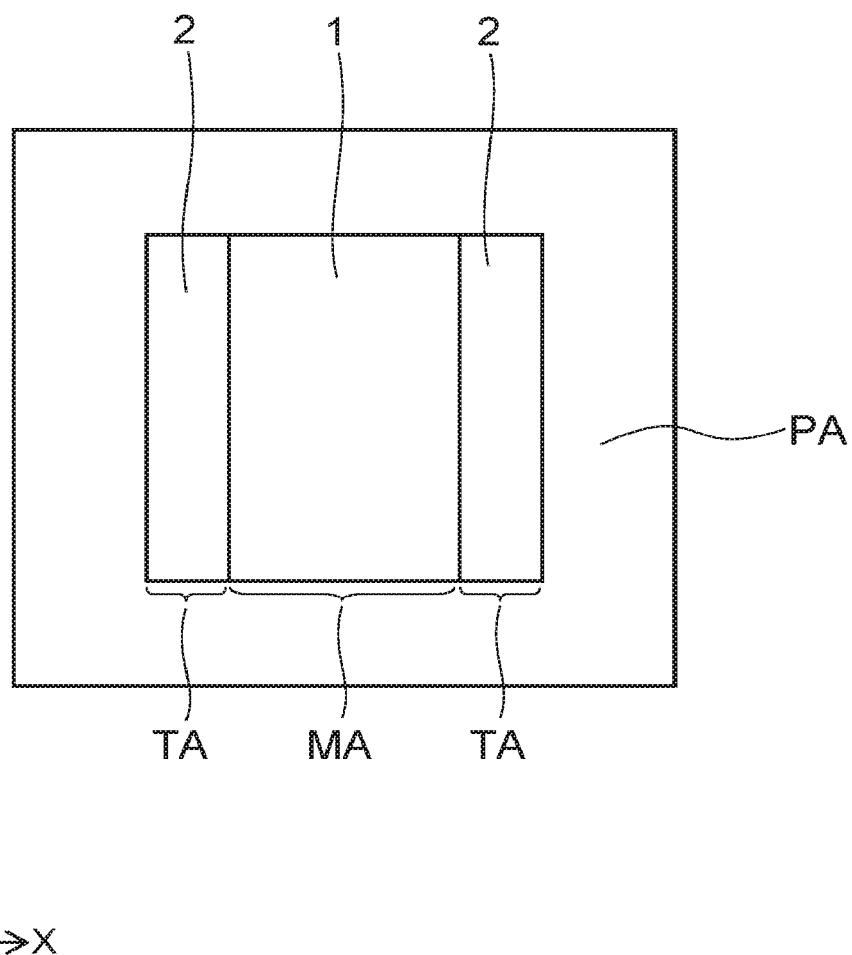
FIG. 1 is a schematic block plan view of a semiconductor device of an embodiment.

According to one embodiment, a semiconductor device includes a substrate, a first stacked portion, a semiconductor body, a charge storage portion, a circuit portion, a second stacked portion, and an insulating layer. The first stacked portion is provided above the substrate. The first stacked portion includes a plurality of electrode layers stacked with an insulator interposed. The semiconductor body extends through the first stacked portion in a stacking direction of the first stacked portion. The charge storage portion is provided between the semiconductor body and one of the electrode layers. The circuit portion includes a transistor provided at a region separated from the first stacked portion in the substrate. The second stacked portion is provided above the circuit portion. The second stacked portion includes a plurality of first layers and a plurality of second layers. The first layers and the second layers include a first layer and a second layer stacked alternately. An insulating layer is provided above the circuit portion and provided above the substrate between the first stacked portion and the second stacked portion. A height of an uppermost first layer of the second stacked portion from a surface of the substrate is substantially equal to a height of an uppermost electrode layer of the first stacked portion from the surface of the substrate, or is higher than the height of the uppermost electrode layer.

Embodiments are described below with reference to the drawings. In the drawings, the same components are denoted by the same reference numerals and signs.

For example, a semiconductor memory device having a memory cell array having a three-dimensional structure is described as a semiconductor device in an embodiment.

FIG. 1 is a schematic block plan view of the semiconductor device of the embodiment.

The semiconductor device of the embodiment includes a memory region MA, a terrace region (or stairstep region) TA, and a peripheral region PA. A memory cell array 1 is provided at the memory region MA. A stairstep portion 2 is provided at the terrace region TA. A circuit portion controlling the memory cell array 1 is provided at the peripheral region PA. The memory cell array 1, the stairstep portion 2, and the circuit portion are provided on the same substrate.

Figure 2:
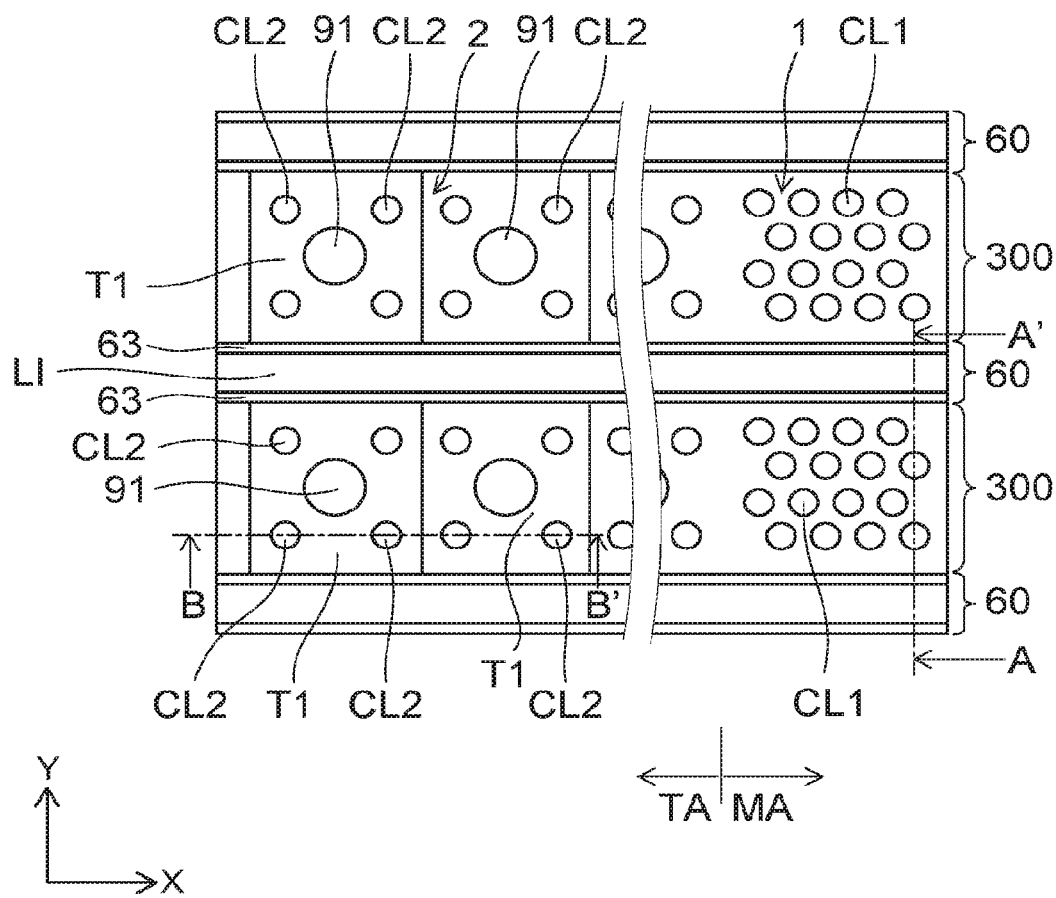
FIG. 2 is a schematic plan view of the semiconductor device of the embodiment.

FIG. 2 is a schematic plan view of the memory region MA and the terrace region (stairstep region) TA.

Figure 3:
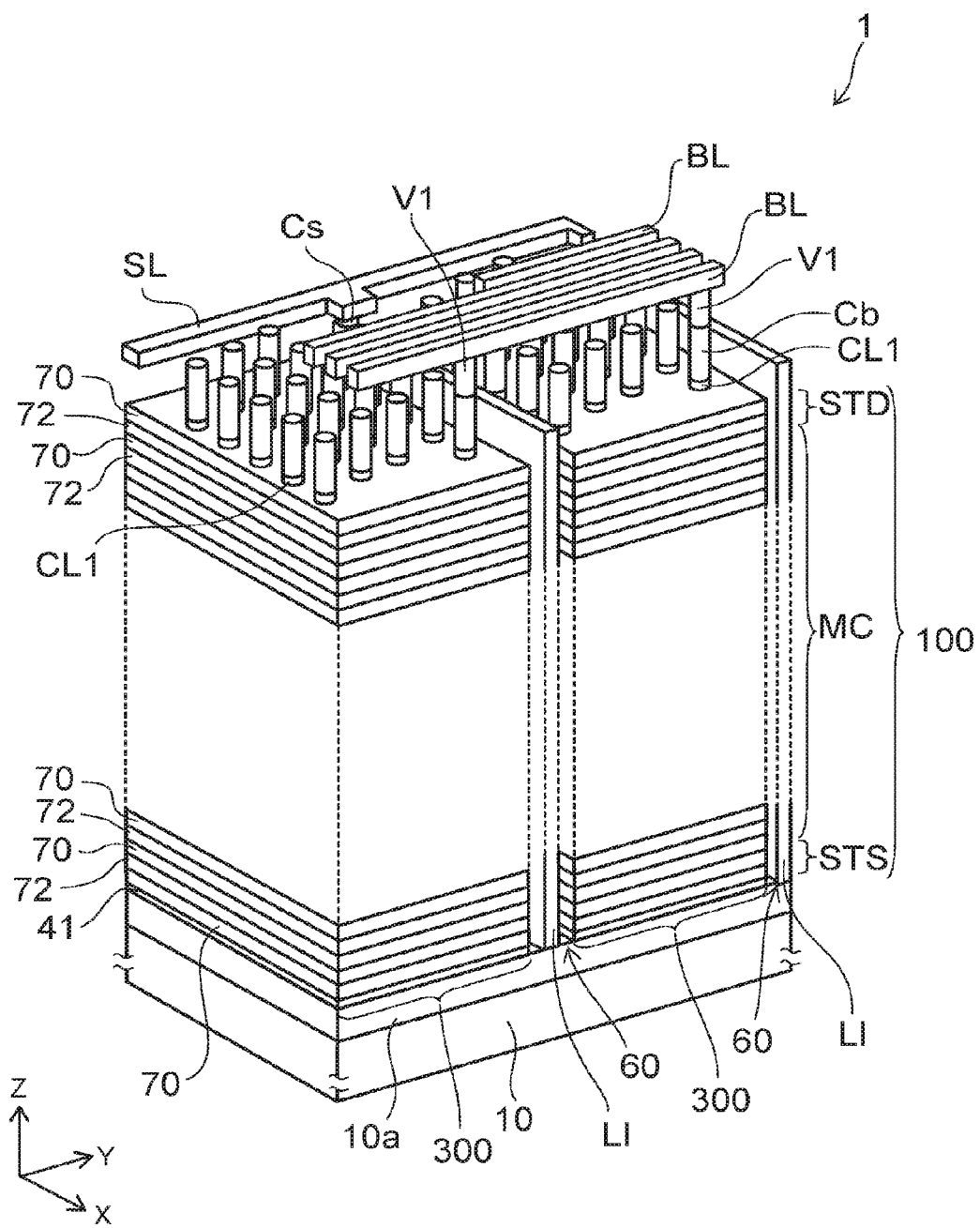
FIG. 3 is a schematic perspective view of a memory cell array of the semiconductor device of the embodiment.

FIG. 3 is a schematic perspective view of the memory cell array 1.

Figure 4:
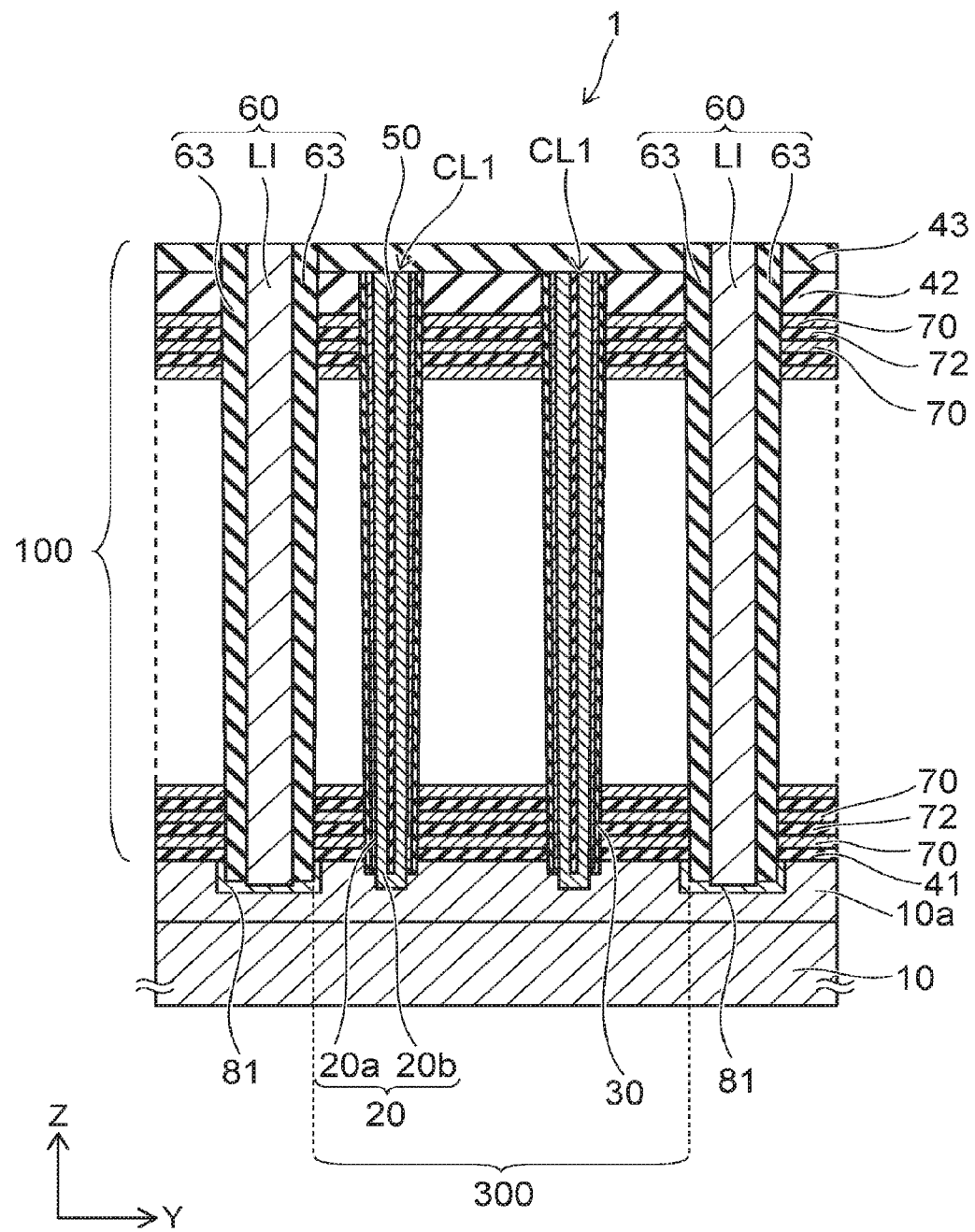
FIG. 4 is an A-A' cross-sectional view of FIG. 2.

FIG. 4 is an A-A' cross-sectional view of FIG. 2.

In FIG. 3, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction shown in the other drawings correspond respectively to the X-direction, the Y-direction, and the Z-direction of FIG. 3.

The memory cell array 1 includes the substrate 10, a first stacked portion 100 provided above the substrate 10, multiple first columnar portions CL1, multiple separation portions 60, and upper layer interconnects provided above the first stacked portion 100. For example, bit lines BL and a source line SL are shown as the upper layer interconnects in FIG. 3.

As shown in FIG. 2, the first columnar portions CL1 are disposed in the memory region MA. The first columnar portions CL1 are formed in substantially circular columnar configurations extending through the first stacked portion 100 in the stacking direction of the first stacked portion 100 (the Z-direction). For example, the first columnar portions CL1 have a staggered arrangement. Or, the first columnar portions CL1 may have a square lattice arrangement along the X-direction and the Y-direction.

As shown in FIG. 2, the separation portions 60 extend in the X-direction in the memory region MA and the terrace region TA, and divide the first stacked portion 100 into multiple blocks (or finger portions) 300 in the Y-direction.

As shown in FIG. 3, the multiple bit lines BL are provided above the first stacked portion 100. The bit lines BL are, for example, metal films extending in the Y-direction. The bit lines BL are separated from each other in the X-direction.

The upper ends of semiconductor bodies 20 of the first columnar portions CL1 described below are connected to the bit lines BL via contacts Cb and contacts V1 shown in FIG. 3.

The first columnar portions CL1 are connected to one common bit line BL. The first columnar portions CL1 that are connected to the common bit line BL include one first columnar portion CL1 selected from each block 300 divided in the Y-direction by the separation portions 60.

As shown in FIG. 4, the first stacked portion 100 includes multiple electrode layers 70 stacked above the substrate 10. The electrode layers 70 are stacked, with insulating layers (insulators) 72 interposed, in the direction (the Z-direction) perpendicular to a major surface of the substrate 10. The electrode layer 70 is a metal layer. The electrode layer 70 is, for example, a tungsten layer including tungsten as a major component or a molybdenum layer including molybdenum as a major component. The insulating layer 72 is a silicon oxide layer including silicon oxide as a major component.

The substrate 10 is, for example, a silicon substrate. An active region 10a is provided on a front surface side of the substrate 10. The active region 10a is, for example, a P-type silicon region (P-type well).

An insulating layer 41 is provided on the front surface of the active region 10a. The lowermost electrode layer 70 is provided on the insulating layer 41. An insulating layer 42 is provided on the uppermost electrode layer 70; and an insulating layer 43 is provided on the insulating layer 42. The insulating layer 43 covers the upper ends of the first columnar portions CL1.

Figure 5A:
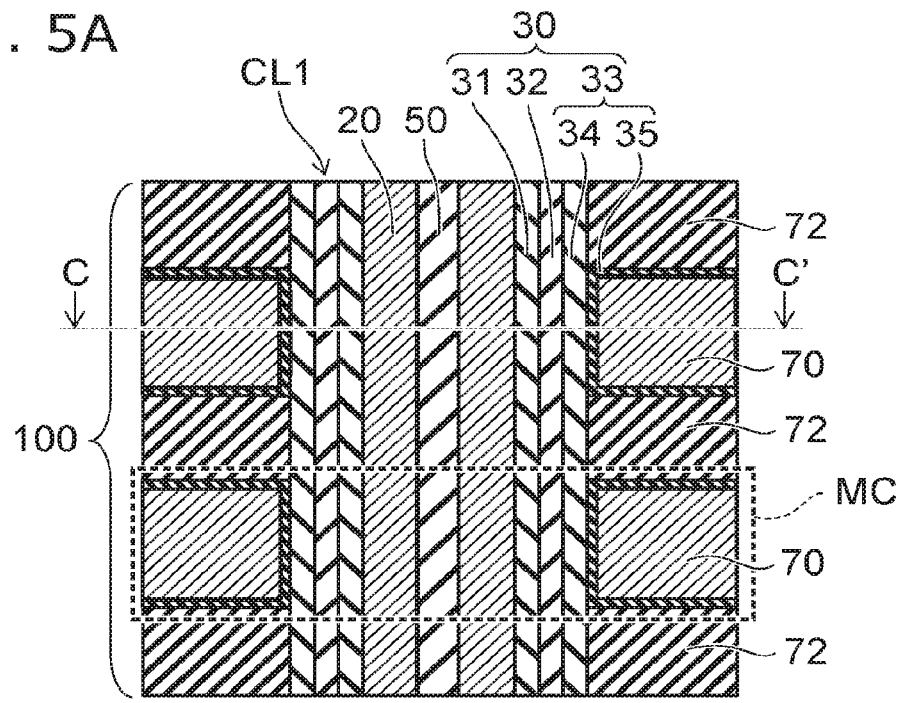
FIG. 5A is an enlarged cross-sectional view of one portion of FIG. 4.

FIG. 5A is an enlarged cross-sectional view of one portion of FIG. 4.

Figure 5B:
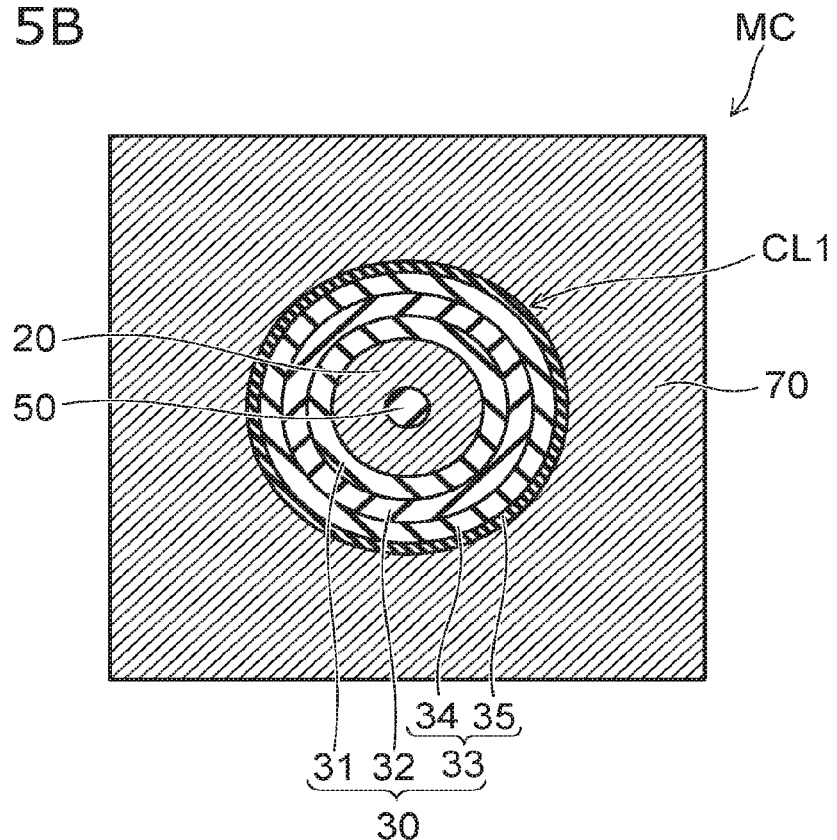
FIG. 5B is a C-C' cross-sectional view of FIG. 5A.

FIG. 5B is a C-C' cross-sectional view of FIG. 5A.

The first columnar portion CL1 includes a stacked film (a memory film) 30, the semiconductor body 20, and an insulative core film 50.

The semiconductor body 20 extends to be continuous in a cylindrical configuration through the first stacked portion 100 in the stacking direction (the Z-direction). The stacked film 30 is provided between the semiconductor body 20 and the electrode layers 70, and surrounds the semiconductor body 20 from the outer circumferential side. The core film 50 is provided on the inner side of the semiconductor body 20 having the cylindrical configuration. The upper end of the semiconductor body 20 is connected to the bit line BL via the contact Cb and the contact V1 shown in FIG. 3. As shown in FIG. 4, a lower end of the semiconductor body 20 contacts the active region 10a.

As shown in FIGS. 5A and 5B, the stacked film 30 includes a tunneling insulating film 31, a charge storage film (a charge storage portion) 32, and a blocking insulating film 33.

The tunneling insulating film 31 is provided between the semiconductor body 20 and the charge storage film 32. The charge storage film 32 is provided between the tunneling insulating film 31 and the blocking insulating film 33. The blocking insulating film 33 is provided between the charge storage film 32 and the electrode layer 70.

A memory cell MC includes the semiconductor body 20, the stacked film 30, and the electrode layer 70. The memory cell MC has a vertical transistor structure in which the electrode layer 70 surrounds, with the stacked film 30 interposed, the periphery of the semiconductor body 20.

In the memory cell MC having the vertical transistor structure, the semiconductor body 20 is, for example, a channel body of silicon; and the electrode layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film. The charge storage film 32 includes, for example, a silicon nitride film. Or, the charge storage film 32 may be a conductive floating gate surrounded with an insulator.

The tunneling insulating film 31 is used as a potential barrier when the charge is injected from the semiconductor body 20 into the charge storage film 32, or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of the charge from the electrode layer 70 into the first columnar portion CL1.

The blocking insulating film 33 includes a first blocking film 34 and a second blocking film 35. The first blocking film 34 is, for example, a silicon oxide film. The second blocking film 35 is a metal oxide film having a higher dielectric constant than that of the silicon oxide film. For example, an aluminum oxide film, a zirconium oxide film, or a hafnium oxide film may be examples of the metal oxide film.

The first blocking film 34 is provided between the charge storage film 32 and the second blocking film 35. The second blocking film 35 is provided between the first blocking film 34 and the electrode layer 70.

The tunneling insulating film 31, the charge storage film 32, and the first blocking film 34 extend to be continuous in the stacking direction (the Z-direction) of the first stacked portion 100.

The second blocking film 35 is provided also between the electrode layer 70 and the insulating layer 72. The second blocking film 35 is formed to be continuous along an upper surface of the electrode layer 70, a lower surface of the electrode layer 70, and a side surface of the electrode layer 70 on the stacked film 30 side. The second blocking film 35 is not continuous in the stacking direction of the first stacked portion 100, and is divided.

Or, the second blocking film 35 may be formed to be continuous along the stacking direction without forming the second blocking film 35 between the electrode layer 70 and the insulating layer 72. Or, the blocking insulating film 33 may be a single-layer film continuous along the stacking direction.

Also, a metal nitride film may be formed between the second blocking film 35 and the electrode layer 70, or between the insulating layer 72 and the electrode layer 70. The metal nitride film is, for example, a titanium nitride film and can function as a barrier metal, an adhesion layer, or a seed metal of the electrode layer 70.

As shown in FIG. 3, a drain-side selection transistor STD is provided at the upper layer portion of the first stacked portion 100 (the upper end portion of the first columnar portion CL1). A source-side selection transistor STS is provided at the lower layer portion of the first stacked portion 100 (the lower end portion of the first columnar portion CL1).

At least the uppermost electrode layer 70 functions as a control gate of the drain-side selection transistor STD. At least the lowermost electrode layer 70 functions as a control gate of the source-side selection transistor STS.

The multiple memory cells MC are provided between the drain-side selection transistor STD and the source-side selection transistor STS. The memory cells MC, the drain-side selection transistor STD, and the source-side selection transistor STS are connected in series via the semiconductor body 20 of the first columnar portion CL1, and are included in one memory string. For example, the memory strings have a staggered arrangement in a planar direction parallel to the XY plane; and the memory cells MC are provided three-dimensionally in the X-direction, the Y-direction, and the Z-direction.

The separation portion 60 will now be described.

As shown in FIG. 2 and FIG. 4, the separation portion 60 includes an interconnect portion LI and an insulating film 63. The insulating film 63 is not illustrated in FIG. 3.

The interconnect portion LI spreads in the X-direction and the Z-direction. The interconnect portion LI is, for example, a film including a metal. The insulating film 63 is provided on the side surface of the interconnect portion LI. As shown in FIG. 4, the insulating film 63 is provided between the first stacked portion 100 and the interconnect portion LI.

As shown in FIG. 4, multiple semiconductor regions 81 are formed in the front surface of the active region 10a. The lower ends of the interconnect portions LI contact the semiconductor regions 81. The multiple semiconductor regions 81 are provided to correspond to the multiple interconnect portions LI. The semiconductor regions 81 include an N-type semiconductor region 81. The interconnect portions LI include the interconnect portion LI that is connected to the N-type semiconductor region 81. The upper end of the interconnect portion LI connected to the N-type semiconductor region 81 is connected to the source line SL via a contact Cs shown in FIG. 3.

By controlling the potential applied to the lowermost electrode layer 70, an N-channel (an inversion layer) can be induced in the front surface of the P-type active region 10a between the N-type semiconductor region 81 and the lower end of the semiconductor body 20; and a current can be caused to flow between the N-type semiconductor region 81 and the lower end of the semiconductor body 20. The lowermost electrode layer 70 functions as a control gate for inducing the channel in the front surface of the active region 10a; and the insulating layer 41 functions as a gate insulating film. In a read operation, electrons are supplied from the interconnect portion LI to the semiconductor body 20 via the N-type semiconductor region 81 and the N-channel.

The terrace region TA will now be described.

Figure 6:
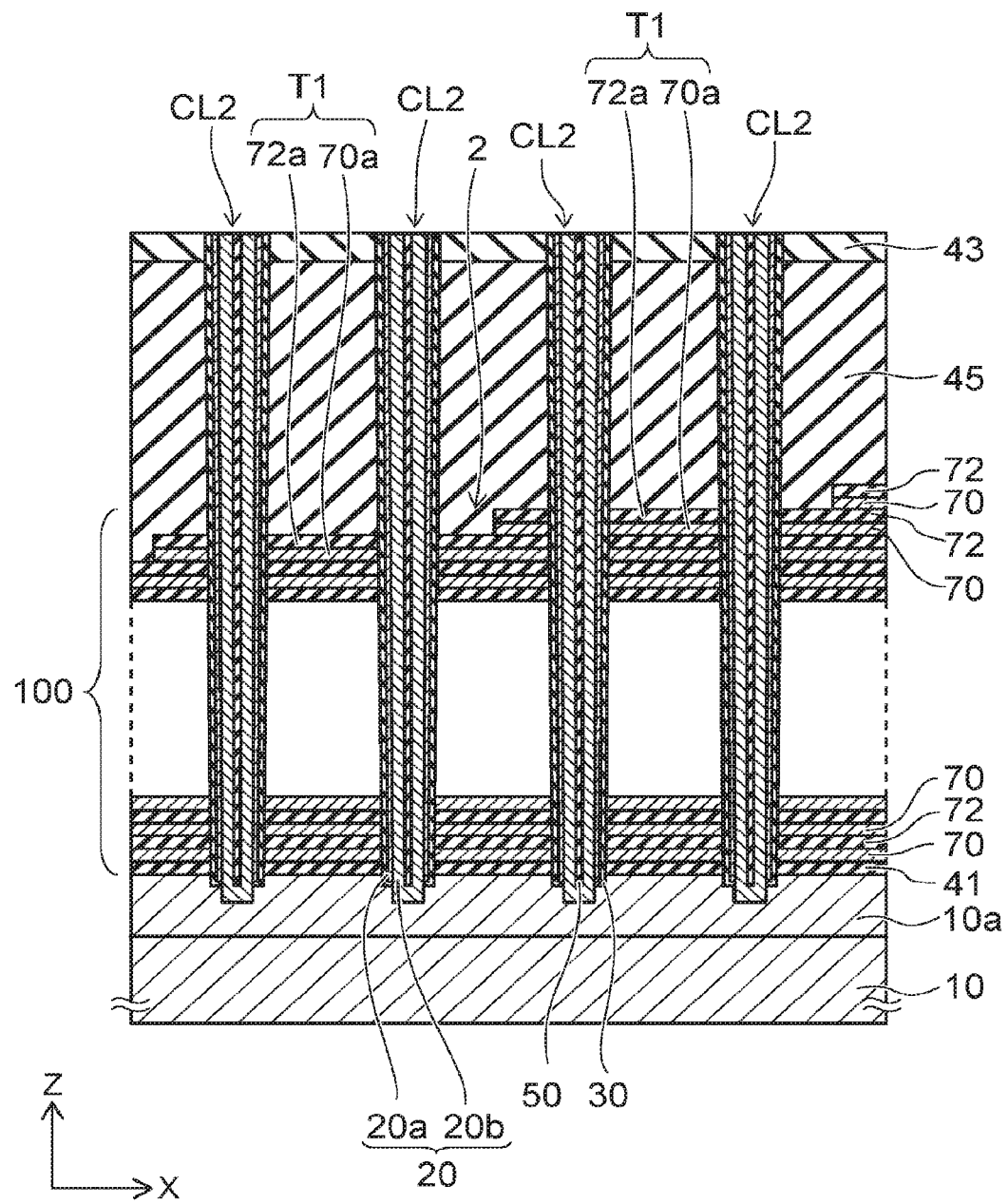
FIG. 6 is a B-B' cross-sectional view of FIG. 2.

FIG. 6 is a B-B' cross-sectional view of FIG. 2.

Figure 7:
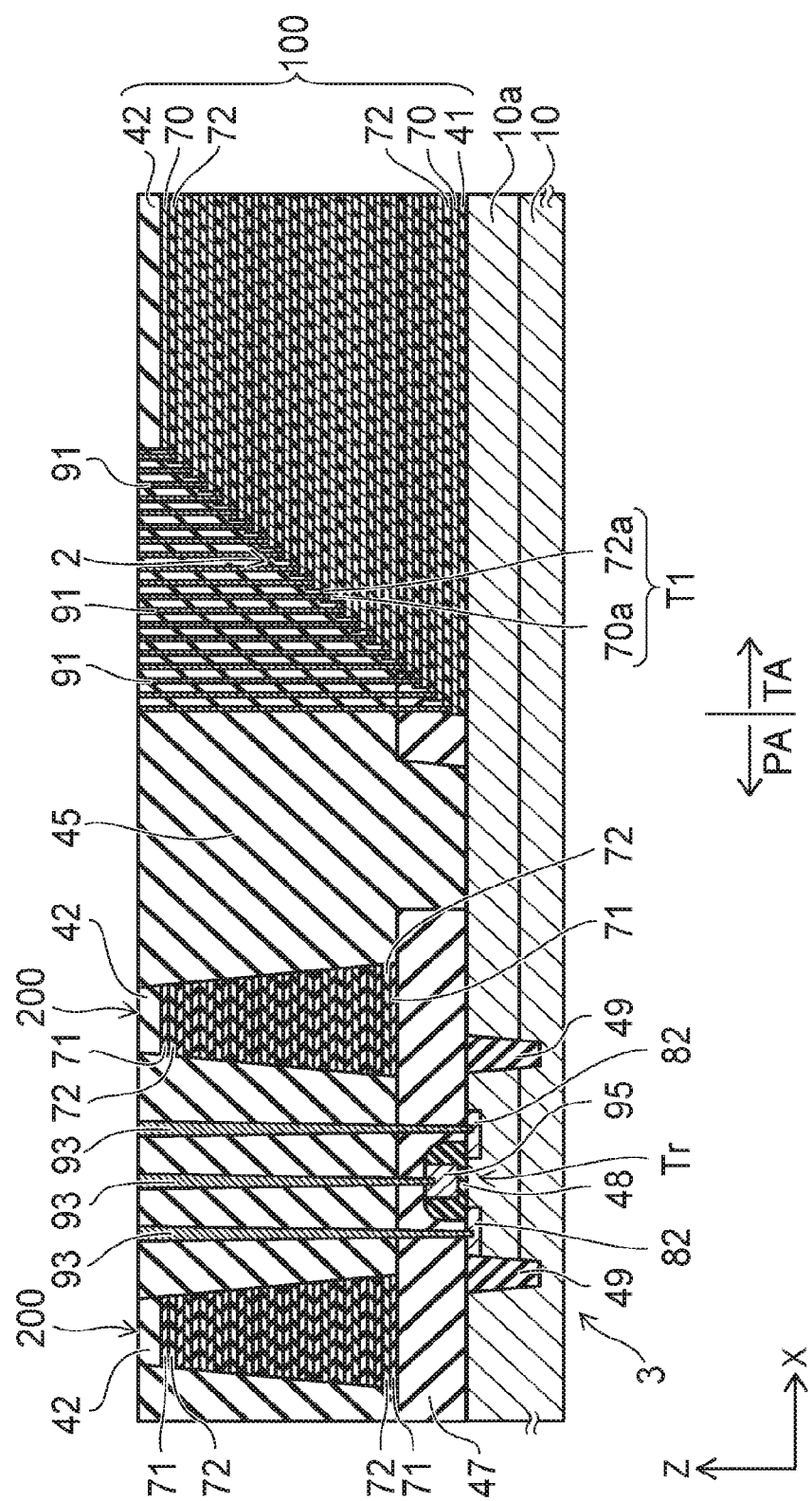
FIG. 7 is a schematic cross-sectional view of a terrace region and a peripheral region of the semiconductor device of the embodiment.

FIG. 7 is a schematic cross-sectional view of the terrace region TA and the peripheral region PA.

The first stacked portion 100 and the separation portion 60 extend in the X-direction from the memory region MA to the terrace region TA. The substrate 10 including the active region 10a is also provided at the terrace region TA.

One portion of the first stacked portion 100 is patterned into a stairstep configuration. The electrode layers 70 have multiple terrace portions 70a arranged in a stairstep configuration with a difference in levels in the X-direction. The insulating layers 72 is also patterned into a stairstep configuration, and have multiple terrace portions 72a arranged in a stairstep configuration with a difference in levels in the X-direction.

A terrace portion T1 of the first stacked portion 100 includes the terrace portion 70a of the electrode layer 70 and the terrace portion 72a of the insulating layer 72. One terrace portion T1 includes one terrace portion 70a and one terrace portion 72a stacked on the terrace portion 70a.

The stairstep portion 2 includes multiple terrace portions T1. Another electrode layer 70 does not overlap each of the terrace portion T1.

An insulating layer 45 is provided above the stairstep portion 2. The insulating layer 45 fills the differences in levels between the terrace portions T1. The insulating layer 45 covers the stairstep portion 2 and the memory cell array 1. And then an upper surface of the insulating layer 45 is planarized so that a height of the upper surface of the insulating layer 45 is substantially equal to a height of an upper surface of the first stacked portion 100.

In this specification, "height" represents a height from the front surface of the substrate 10.

The separation portions 60 divide the insulating layer 45 of the terrace region TA and the first stacked portion 100 below the insulating layer 45 into multiple blocks (or finger portions) 300 in the Y-direction.

As shown in FIG. 2 and FIG. 6, multiple second columnar portions CL2 are disposed at the terrace region TA. The second columnar portions CL2 are formed in substantially circular columnar configurations extending through the insulating layer 45 and the first stacked portion 100 below the insulating layer 45 in the stacking direction (the Z-direction).

The second columnar portions CL2 pierce the insulating layer 45 and the first stacked portion 100, and reach the substrate 10. The second columnar portions CL2 pierce the terrace portion T1.

At least one second columnar portion CL2 is disposed at one terrace portion T1. In the example shown in FIG. 2, for example, four second columnar portions CL2 are disposed at one terrace portion T1.

As shown in FIG. 2, the first columnar portions CL1 of the memory region MA are arranged more densely than the second columnar portions CL2 of the terrace region TA.

For example, the second columnar portions CL2 and the first columnar portions CL1 are simultaneously formed. As shown in FIG. 6, the second columnar portion CL2 includes the stacked film (insulating film) 30, the semiconductor body 20, and the core film 50 similar to the first columnar portion CL1.

Upper end portion of the semiconductor body 20 of the second columnar portion CL2 is not connected to the upper interconnect. The upper end portion of the semiconductor body 20 of the second columnar portion CL2 is not electrically connected to anything. The second columnar portion CL2 does not function as elements of the memory cell and selection transistor. The second columnar portion CL2 functions as a mere column supporting the insulating layers 72 when gaps described below are formed.

As shown in FIG. 7, multiple contact portions 91 are provided above the terrace portions T1. At least one contact portion 91 is disposed at one terrace portion T1. The multiple contact portions 91 are provided above the stairstep portion 2 to correspond to the multiple terrace portions T1.

The contact portion 91 is a conductor having a substantially circular columnar configuration. The contact portion 91 is a metal body, and includes, for example, tungsten or molybdenum as a major component.

The contact portions 91 extend in the stacking direction of the first stacked portion 100 through the insulating layer 45, and contacting the terrace portions 70a of the electrode layers 70. The contact portions 91 are connected to not-illustrated upper layer interconnects. The upper layer interconnects are electrically connected to a circuit portion 3 described below. The potential of the electrode layers 70 of the memory cell array 1 is controlled via the contact portions 91 and the terrace portions 70a.

The peripheral region PA will now be described.

As shown in FIG. 7, the substrate 10 including the active region 10a is also provided at the peripheral region PA. The active region 10a in the peripheral region PA and the active regions 10a in the terrace region TA and the memory region MA are isolated by an element isolation portion 49. The element isolation portion 49 includes, for example, shallow trench isolation (STI) structure in which an insulating film is buried in a trench.

The circuit portion 3 including a transistor Tr is provided at the peripheral region PA. The circuit portion 3 includes multiple transistors Tr although one transistor Tr is illustrated in FIG. 7. The transistors Tr are isolated each other by the element isolation portion 49.

The transistor Tr includes a semiconductor region 82 as a source region or drain region, a gate insulating film 48, and a gate electrode 95. The semiconductor region 82 is formed at the surface of the active region 10a. The gate electrode 95 is provided, with the gate insulating film 48 interposed, on a region (channel region) between the source region and the drain region of the semiconductor region 82 in the active region 10a.

The insulating layer 47 is provided above the substrate 10 in the peripheral region PA so as to cover the transistor Tr. The insulating layer 45 is provided on the insulating layer 47.

The transistor Tr is connected to an upper interconnect not shown in the figure provided on the insulating layer 45 via an electrode 93. The electrode 93 extends in the Z-direction through the insulating layers 45 and 47, and is connected to the semiconductor region 82 and the gate electrode 95 of the transistor Tr.

A second stacked portion 200 is provided on the insulating layer 47 of the circuit portion 3. A plurality of columnar second stacked portion 200 are disposed above the circuit portion 3. The second stacked portion 200 may extends in the X-direction or the Y-direction in a wall shape.

The second stacked portion 200 includes a plurality of first layers 71 and a plurality of second layers 72. The first layer 71 and the second layer 72 are stacked alternately. The insulating layer 42 is provided at the uppermost layer of the second stacked portion 200.

A material of the first layer 71 is different from a material of the electrode layer 70 of the first stacked portion 100. The first layer 71 is an insulating layer. The first layer 71 is, for example, a silicon nitride layer. The second layer 72 is, for example, a silicon oxide layer having the same material as the insulating layer 72 of the first stacked portion 100.

The number of the electrode layers 70 of the first stacked portion 100 is greater than the number of the first layers 71 of the second stacked portion 200.

The first stacked portion 100 is provided also below the upper surface of the insulating layer 47 on the circuit portion 3. The height of the lowermost electrode layer 70 of the first stacked portion 100 from the surface of the substrate 10 is lower than the height of the lowermost first layer 71 of the second stacked portion 200 from the surface of the substrate 10.

The number of the electrode layers 70 positioned higher than the upper surface of the insulating layer 47 on the circuit portion 3 of the electrode layers 70 of the first stacked portion 100 is equal to the number of the first layers 71 of the second stacked portion 200.

The height of the uppermost first layer 71 of the second stacked portion 200 from the surface of the substrate 10 is substantially equal to the height of the uppermost electrode layer 70 of the first stacked portion 100 from the surface of the substrate 10.

Or, the height of the uppermost first layer 71 of the second stacked portion 200 from the surface of the substrate 10 is higher than the height of the uppermost electrode layer 70 of the first stacked portion 100 from the surface of the substrate 10. As described later, the first layer 71 is provided at a layer correspond to the electrode layer 70 of the first stacked portion 100 prior to forming the electrode layer 70. The first layer 71 is removed to form a gap between the second layers 72. The electrode layer 70 is formed in the gap.

The second layers 72 stacked with the gap interposed are supported by the first columnar portion CL1 and the second columnar portion CL2 to keep the gap. In that state, the gap may be narrower. The narrowed gap may lower the upper surface of the first stacked portion 100 by several tens of nanometers.

As described later, the height of the uppermost first layer 71 of the second stacked portion 200 is substantially equal to the height of the uppermost first layer 71 of the first stacked portion 100. After replacing the first layer 71 of the first stacked portion 100 with the gap and then the electrode layer 70, the height of the uppermost first layer 71 of the first stacked portion 100 may be lower than the height of the uppermost first layer 71 of the second stacked portion 200.

The terrace region TA including the stairstep portion 2 of the first stacked portion 100 is provided between the peripheral region PA including the circuit portion 3 and the second stacked portion 200, and the memory region MA including the memory cell array 1.

The insulating layer 45 is provided on the insulating layer 47 in the peripheral region PA and the stairstep portion 2 in the terrace region TA. The insulating layer 45 is provided also on the substrate 10 between the peripheral region PA and the terrace region TA (the first stacked portion 100).

The insulating layer 45 in the peripheral region PA covers a side surface of the second stacked portion 200 and a side surface of the electrode 93. An upper surface of the insulating layer 45 in the peripheral region PA is planarized. The height of the upper surface of the insulating layer 45 in the peripheral region PA is substantially equal to the height of the upper surface of the second stacked portion 200.

Figure 8A:
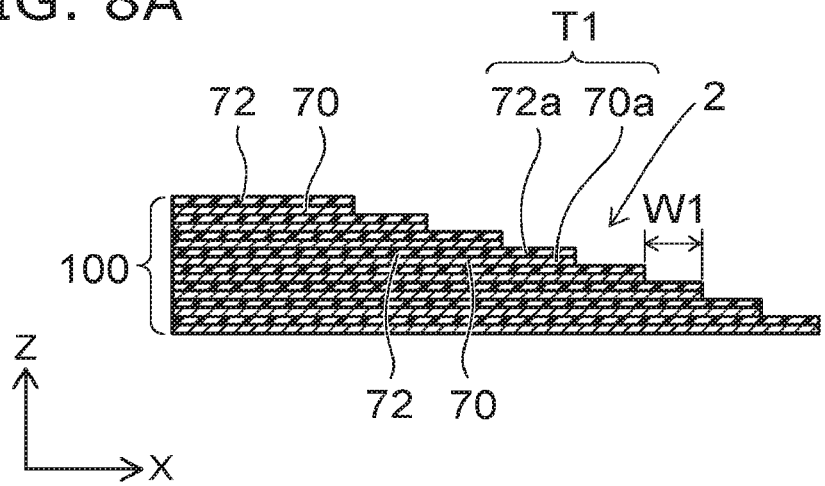
FIG. 8A is a schematic cross-sectional view of a stairstep portion of a first stacked portion of the semiconductor device of the embodiment.
Figure 8B:
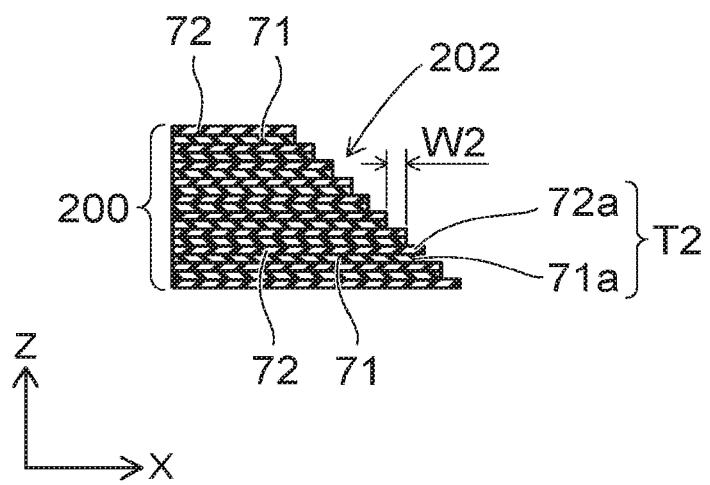
FIG. 8B is a schematic cross-sectional view of a stairstep portion of a second stacked portion of the semiconductor device of the embodiment.

FIG. 8A is a schematic cross-sectional view of the stairstep portion 2 of the first stacked portion 100, and FIG. 8B is a schematic cross-sectional view of a stairstep portion 202 of the second stacked portion 200.

The second stacked portion 200 have multiple terrace portions T2 arranged in a stairstep configuration with a difference in levels in the X-direction. The first layers 71 of the second stacked portion 200 have multiple terrace portions 71a arranged in a stairstep configuration with a difference in levels in the X-direction. The second layers 72 of the second stacked portion 200 have multiple terrace portions 72a arranged in a stairstep configuration with a difference in levels in the X-direction. One terrace portion T2 includes one terrace portion 71a and one terrace portion 72a stacked on the terrace portion 71a.

The terrace portions T2 are formed on both sides in the X-direction of the second stacked portion 200 shown in FIG. 7. The width W2 in the X-direction of the terrace portion T2 of the second stacked portion 200 is narrower than the width W1 in the X-direction of the terrace portion T1 of the first stacked portion 100.

Figure 9:
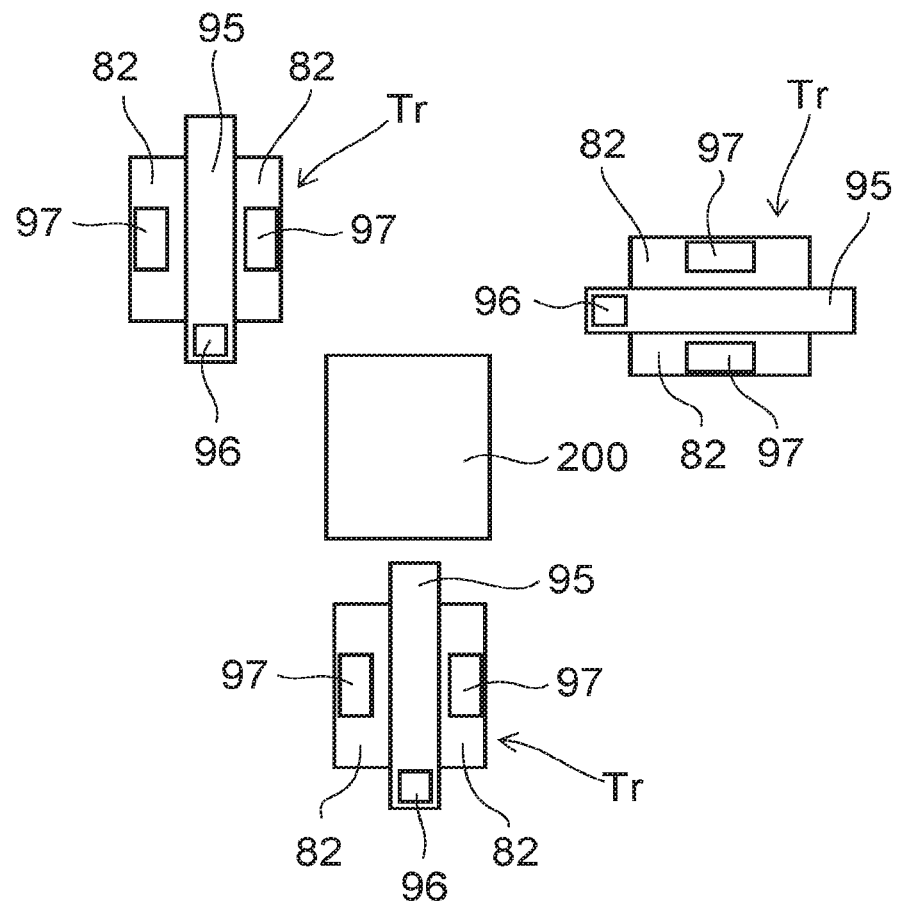
FIG. 9 is a schematic planer layout view of the peripheral region of the semiconductor device of the embodiment.

FIG. 9 is a schematic planer layout view of the peripheral region PA.

A lower end of the electrode 93 in the peripheral region PA shown in FIG. 7 contacts the contact portion 97 of the semiconductor region 82 and the contact portion 96 of the gate electrode 95 of the transistor Tr shown in FIG. 9.

The second stacked portion 200 is disposed at a region not overlapping the electrode 93, the contact portion 96, and the contact portion 97. The second stacked portion 200 does not contact the side surface of the electrode 93.

The first stacked portion 100 includes the layers of dissimilar materials stacked alternately. The insulating layer 45 is a single layer film of silicon oxide. Therefore, the stress difference between the first stacked portion 100 and the insulating layer 45 is generated. The second stacked portion 200 provided or left in the peripheral region PA reduces relatively the volume of the insulating layer 45 in the peripheral region PA. This reduces the stress difference between the region (the memory region MA and the terrace region TA) including the first stacked portion 100 and the peripheral region PA including the insulating layer 45. The stress of the insulating layer 45 is dispersed by the second stacked portion 200, and the stress applied to the first stacked portion 100 from the insulating layer 45 can be reduced. This suppresses the distortion of the memory cell array 1.

A method for manufacturing the semiconductor device of the embodiment will now be described.

First, the processes for the memory region MA will be described with reference to FIG. 10 to FIG. 20.

FIGS. 10 to 20 are cross-sectional views corresponding to the A-A' cross-sectional view in FIG. 2.

Figure 10:
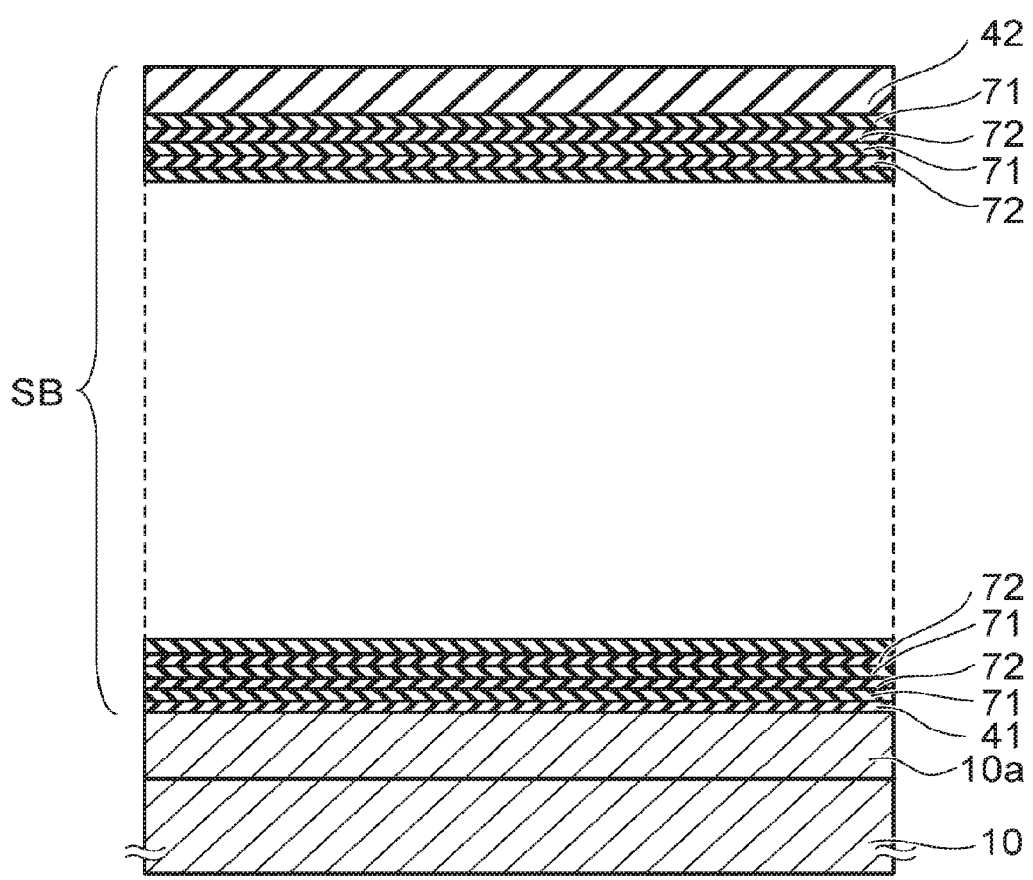
FIGS. 10 to 30D are schematic cross-sectional views showing a method for manufacturing the semiconductor device of the embodiment.

As shown in FIG. 10, the stacked body SB including a plurality of first layers 71 and a plurality of second layers 72 is formed on the active region 10a of the substrate 10. The insulating layer 41 is formed on the active region 10a. The first layer (sacrificial layer) 71 and the second layer (insulating layer) 72 are stacked alternately on the insulating layer 41. The process of alternately stacking the first layer 71 and the second layer 72 is repeated. The insulating layer 42 is formed on the uppermost first layer 71. For example, the first layers 71 are silicon nitride layers, and the second layers 72 are silicon oxide layers.

Subsequently, as described later with reference to FIG. 23, the stacked body SB is divided into the first stacked portion 100 on the memory region MA and the terrace region TA, and the second stacked portion 200 on the circuit portion 3.

Figure 11:
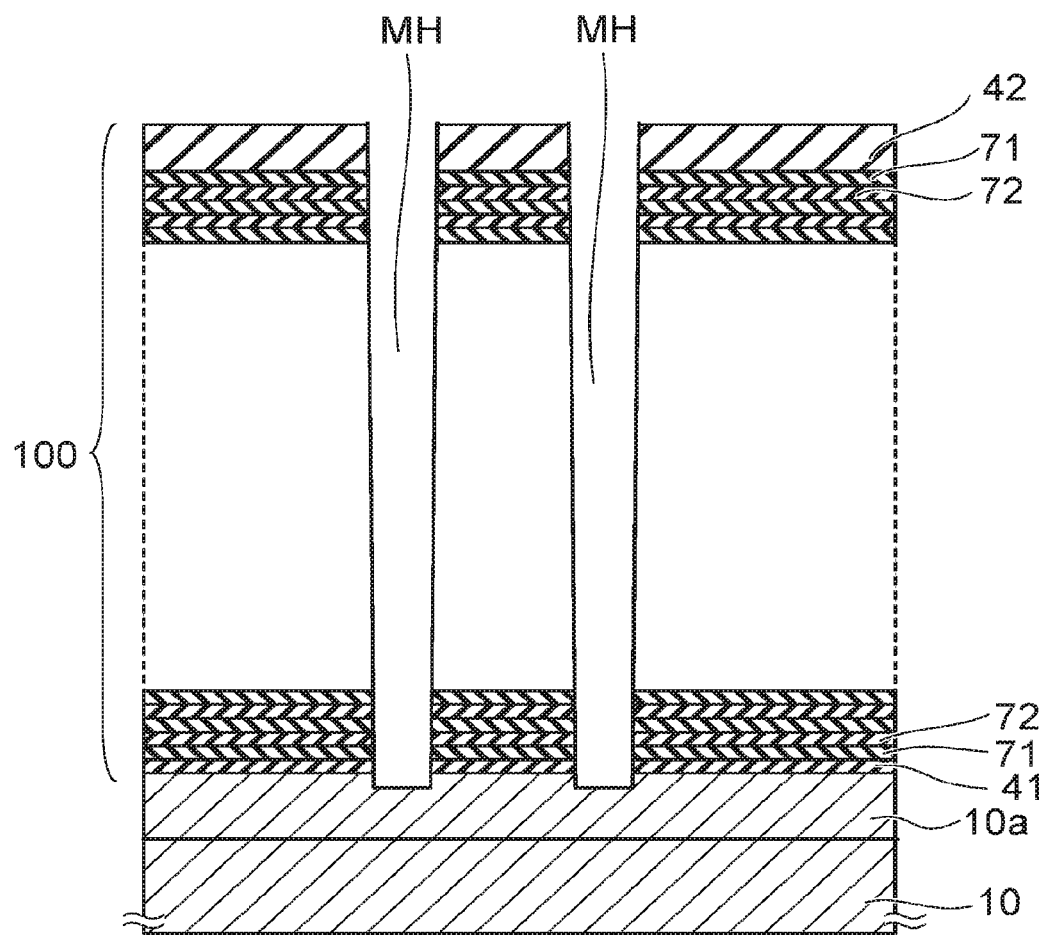

As shown in FIG. 11, multiple memory holes MH are formed in the first stacked portion 100 in the memory region MA. The memory holes MH are formed by reactive ion etching (RIE) using a not-illustrated mask layer. The memory holes MH pierce the insulating layer 42, the first layers 71, the second layers 72, and the insulating layer 41, and reach the active region 10a.

Figure 12:
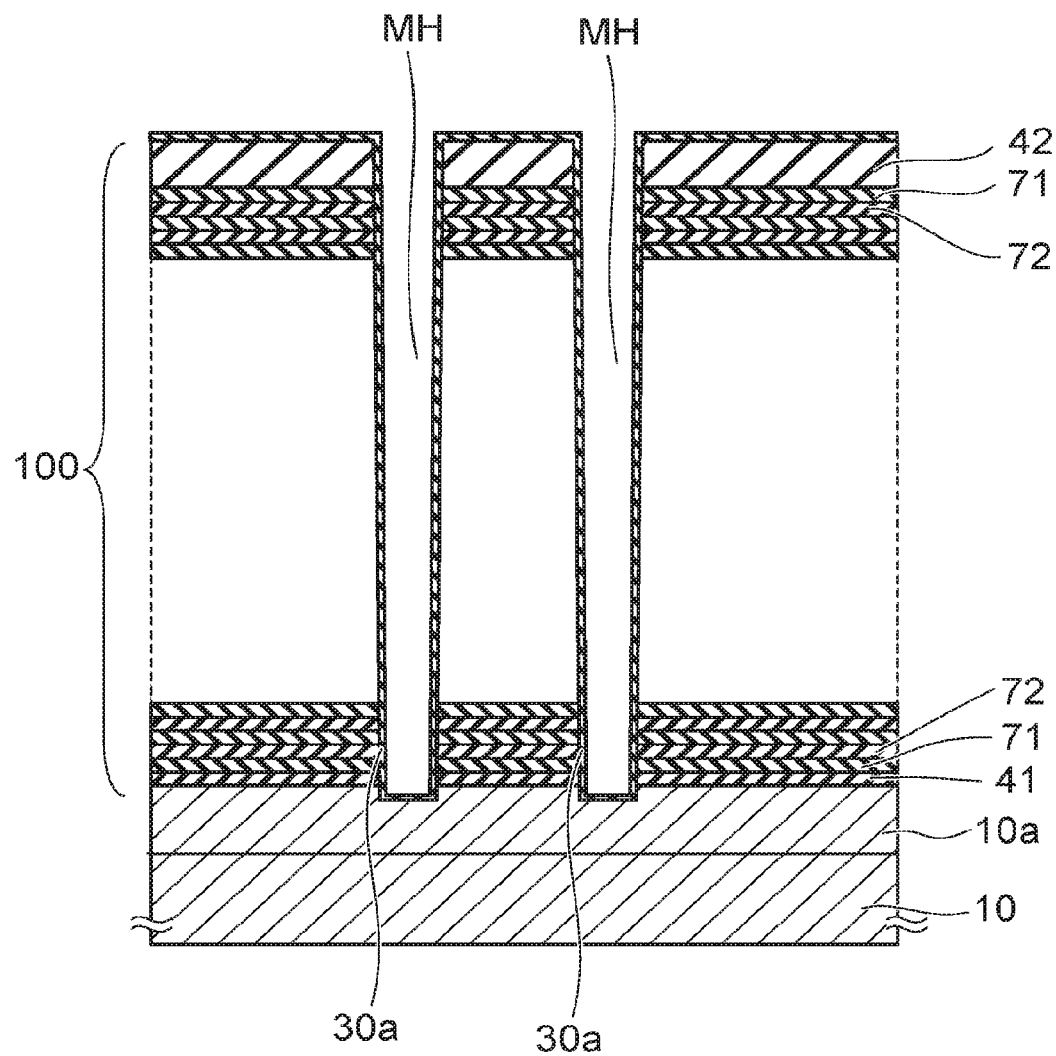

As shown in FIG. 12, a stacked film 30a is formed inside the memory hole MH. The stacked film 30a is formed conformally along the side surface and bottom of the memory hole MH. The stacked film 30a includes, for example, the tunneling insulating film 31, the charge storage film 32, and the first blocking film 34 of the stacked film 30 shown in FIG. 5A and FIG. 5B. The first blocking film 34, the charge storage film 32, and the tunneling insulating film 31 are formed in order inside the memory hole MH.

Figure 13:
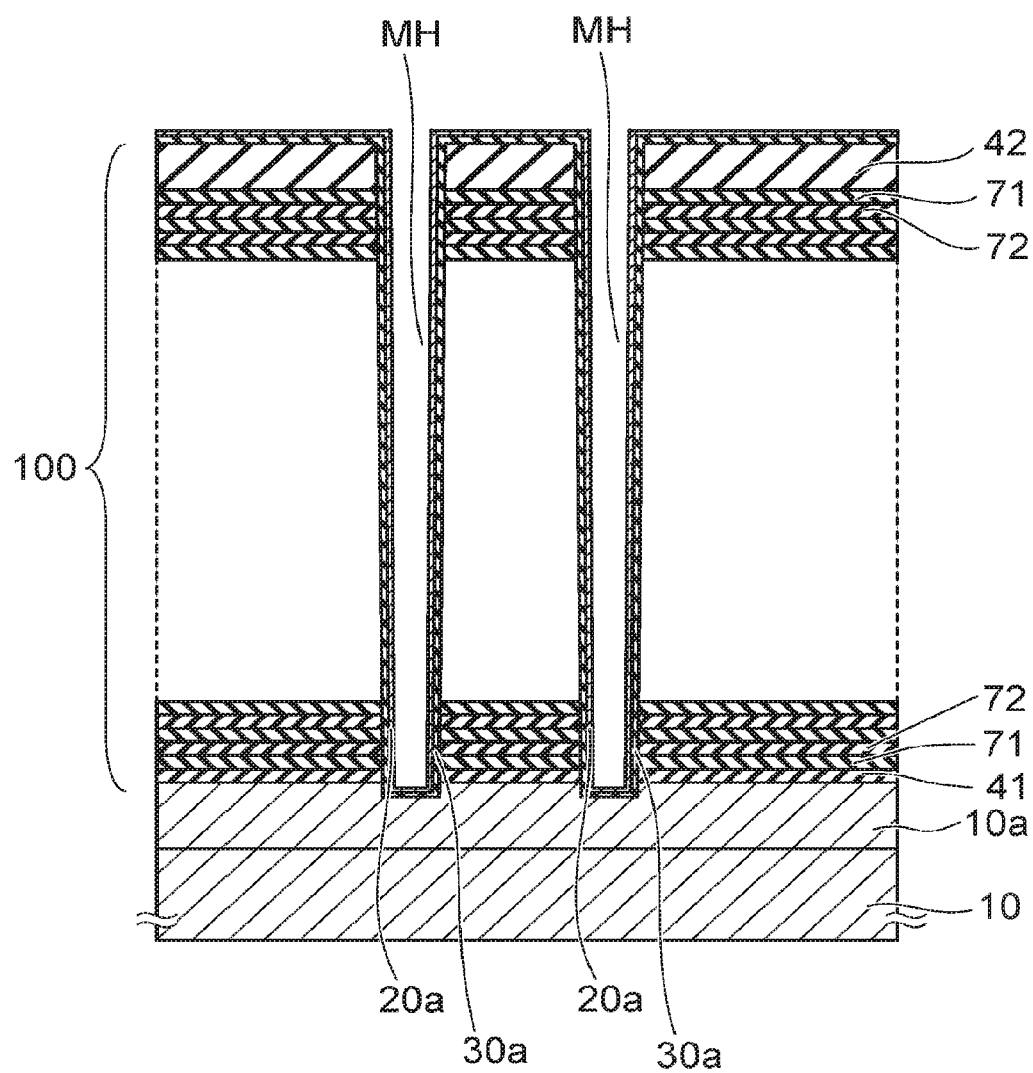

As shown in FIG. 13, a cover silicon 20a is formed on the inner side of the stacked film 30a. The cover silicon 20a is formed conformally along the side surface and bottom of the memory hole MH.

Figure 14:
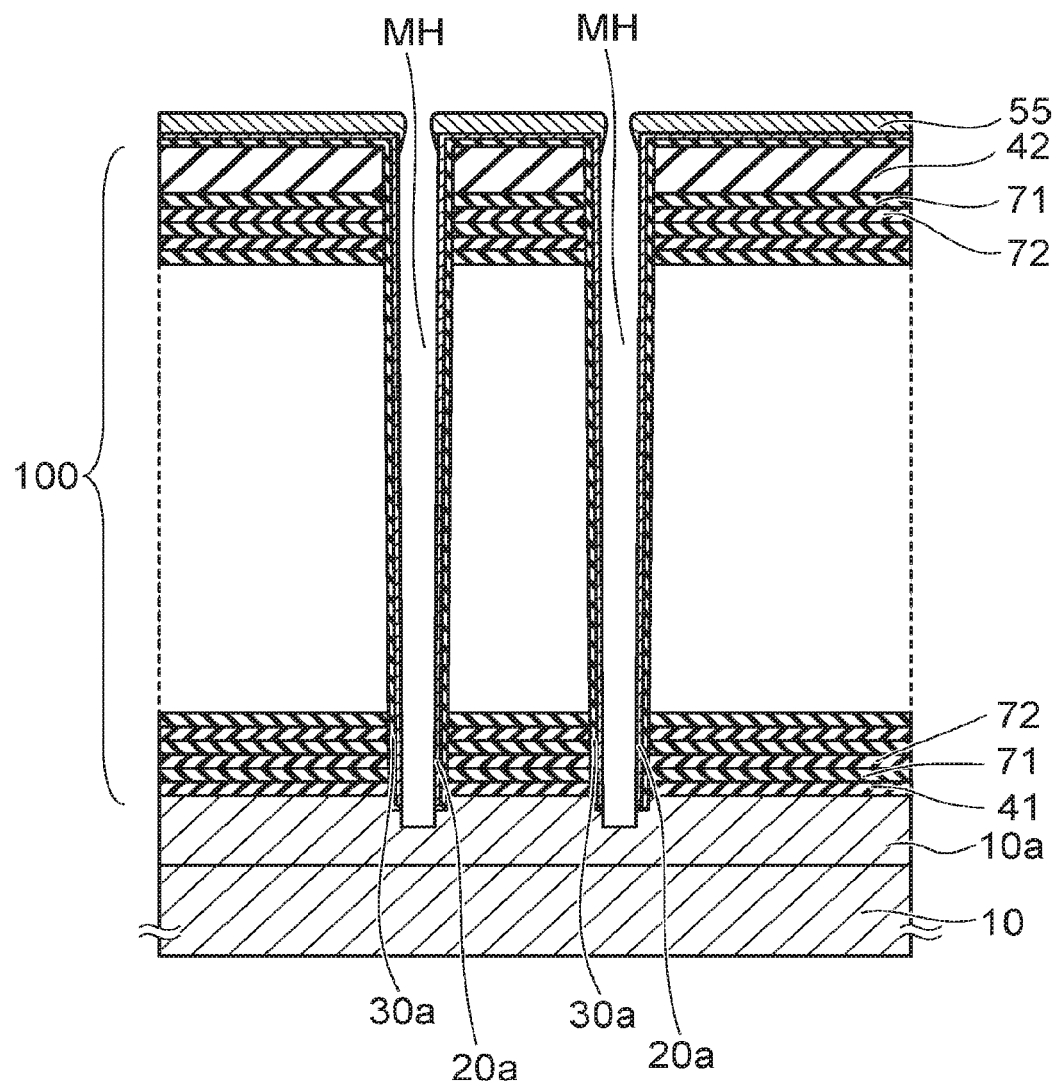

Then, as shown in FIG. 14, a mask layer 55 is formed on the insulating layer 42; and the cover silicon 20a and the stacked film 30a deposited on the bottom of the memory hole MH are removed by RIE. In the RIE, the stacked film 30a formed on the side surface of the memory hole MH is covered with and protected by the cover silicon 20a and is not damaged by the RIE.

Figure 15:
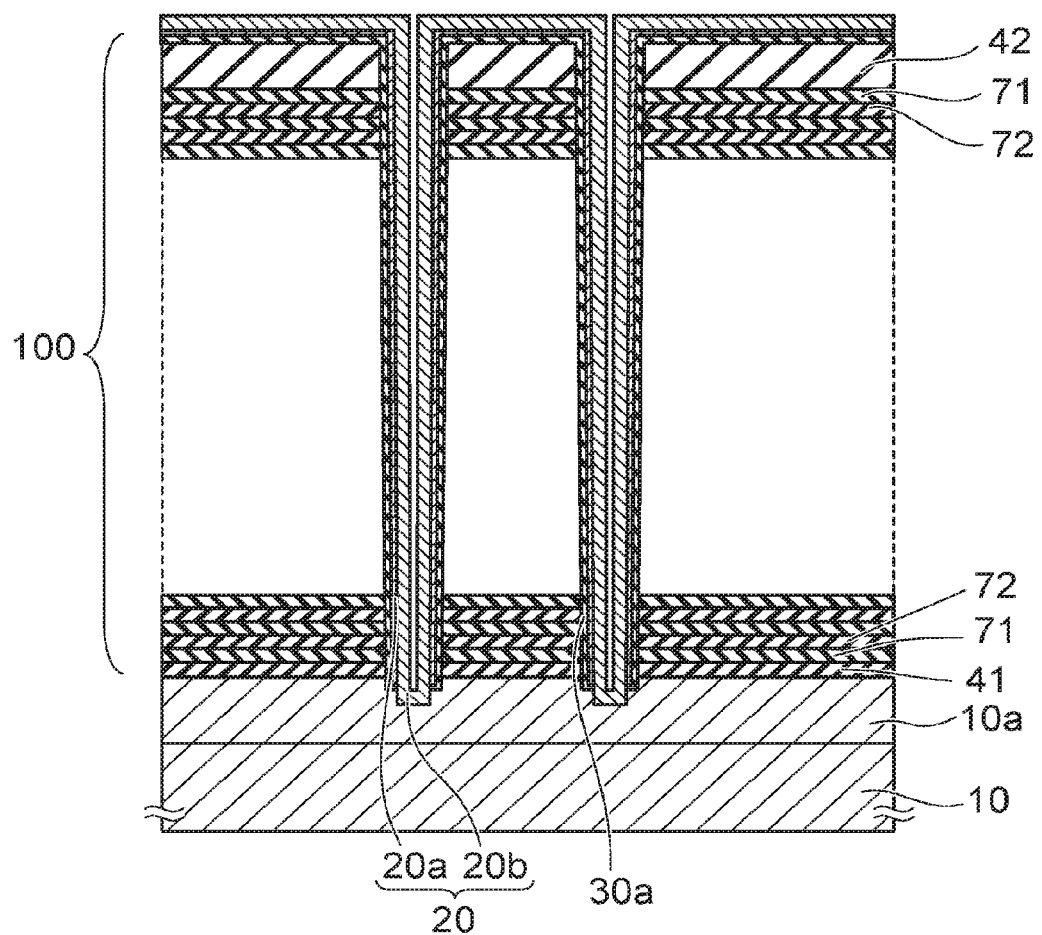

After removing the mask layer 55, a silicon body 20b is formed inside the memory hole MH as shown in FIG. 15. The silicon body 20b is formed on the side surface of the cover silicon 20a and the active region 10a at the bottom of the memory hole MH. The lower end of the silicon body 20b contacts the active region 10a.

For example, the cover silicon 20a and the silicon body 20b are formed as amorphous silicon films, and subsequently crystallized into polycrystalline silicon films by heat treatment.

Figure 16:
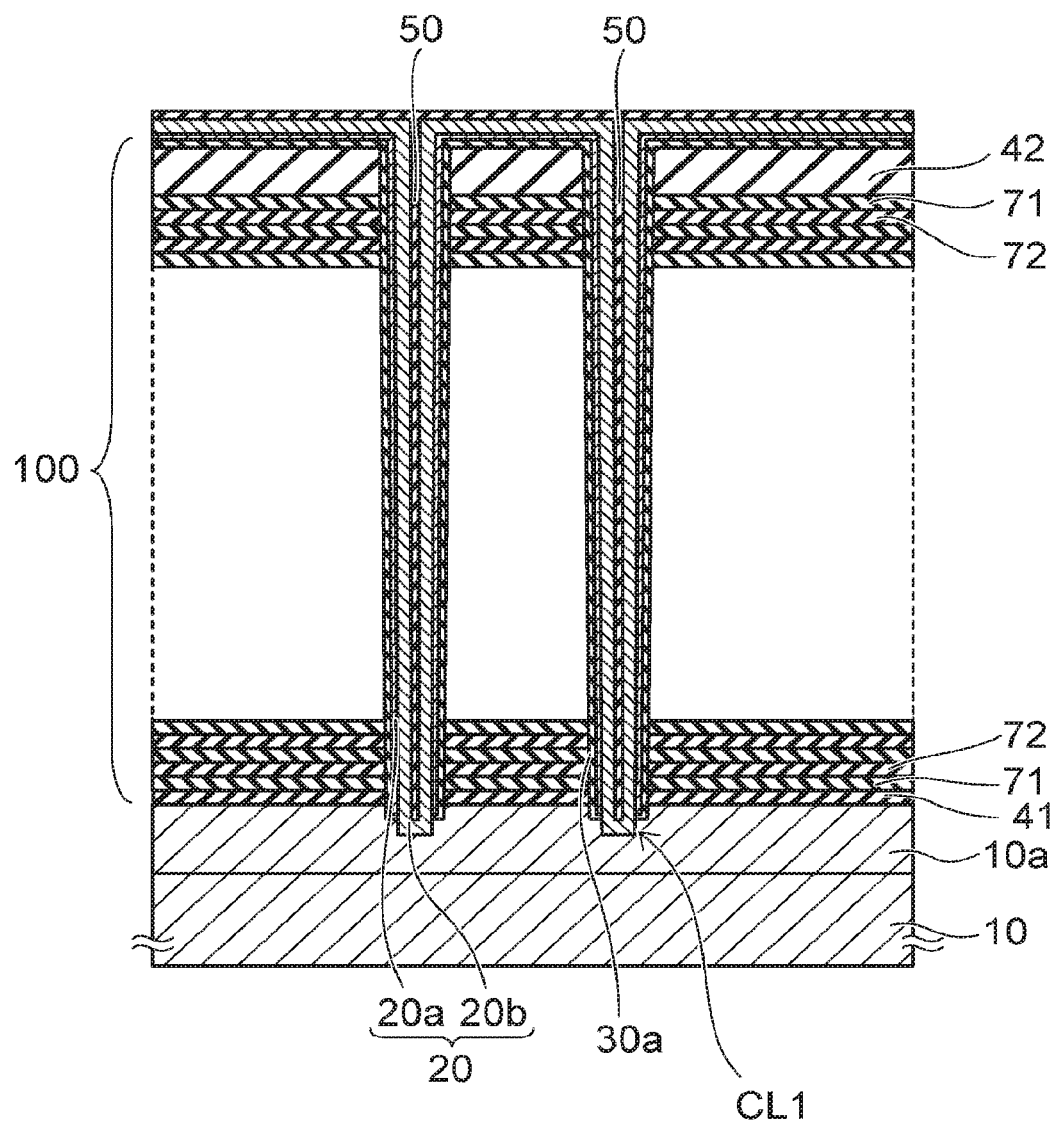

As shown in FIG. 16, the core film 50 is formed on the inner side of the silicon body 20b. The multiple first columnar portions CL1 that include the stacked film 30a, the semiconductor body 20, and the core film 50 are formed inside the first stacked portion 100 in the memory region MA.

The films deposited on the insulating layer 42 shown in FIG. 16 are removed by chemical mechanical polishing (CMP) or etch-back.

Figure 17:
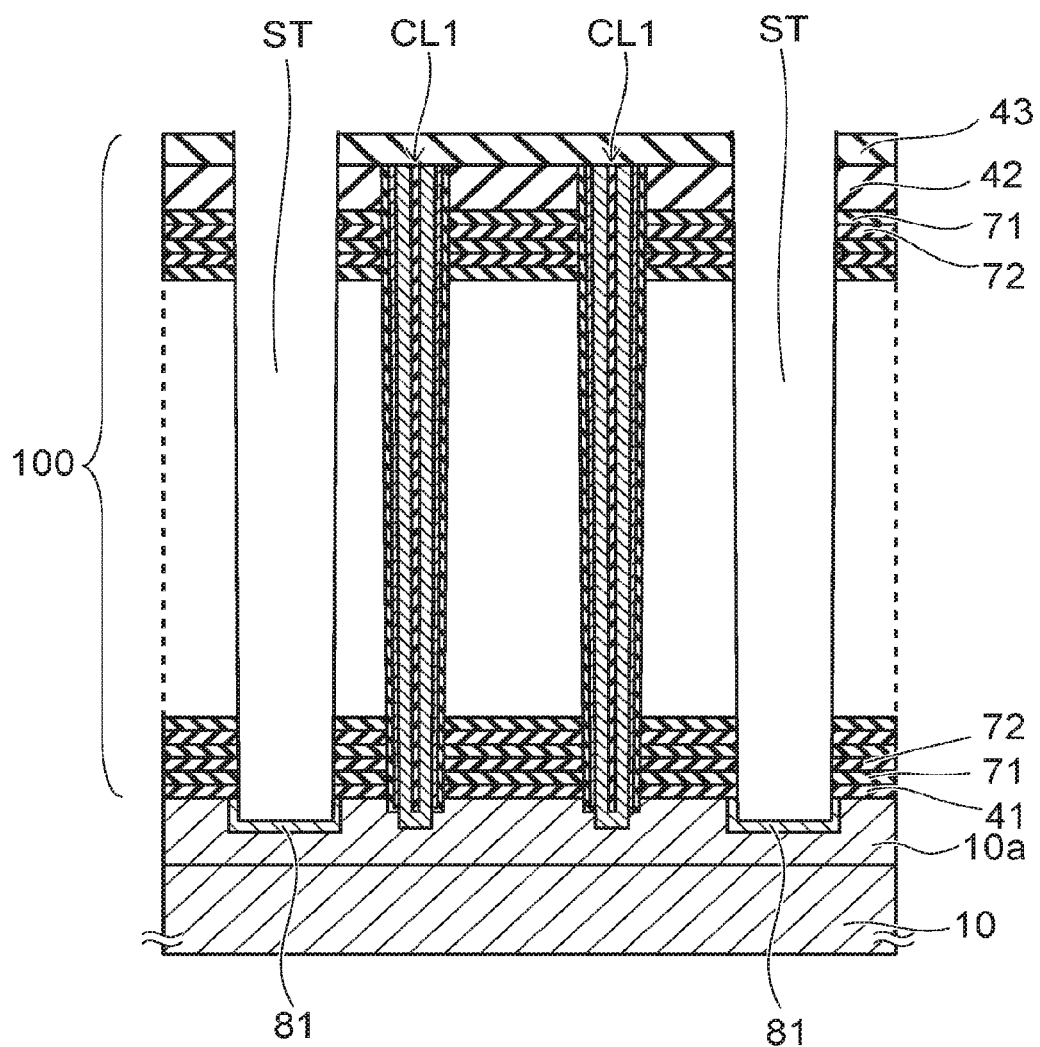

Subsequently, as shown in FIG. 17, the insulating layer 43 is formed on the insulating layer 42. The insulating layer 43 covers the upper ends of the first columnar portions CL1.

Then, multiple slits ST are formed in the first stacked portion 100 by RIE using a not-illustrated mask layer. The slits ST pierce the insulating layer 43, the insulating layer 42, the first layers 71, the second layers 72, and the insulating layer 41, and reach the active region 10a. The slits ST extend in the X-direction, and are formed also in the first stacked portion 100 in the terrace portion TA and the insulating layer 45 on the stairstep portion 2.

The N-type semiconductor region 81 is formed in the surface of the active region 10a at the bottom of the slit ST by implanting an impurity by ion implantation into the active region 10a exposed at the bottom of the slit ST.

Then, the first layers 71 are removed by an etchant or an etching gas supplied through the slits ST. For example, the first layers 71 which are silicon nitride layers are removed using an etchant including phosphoric acid.

Figure 18:
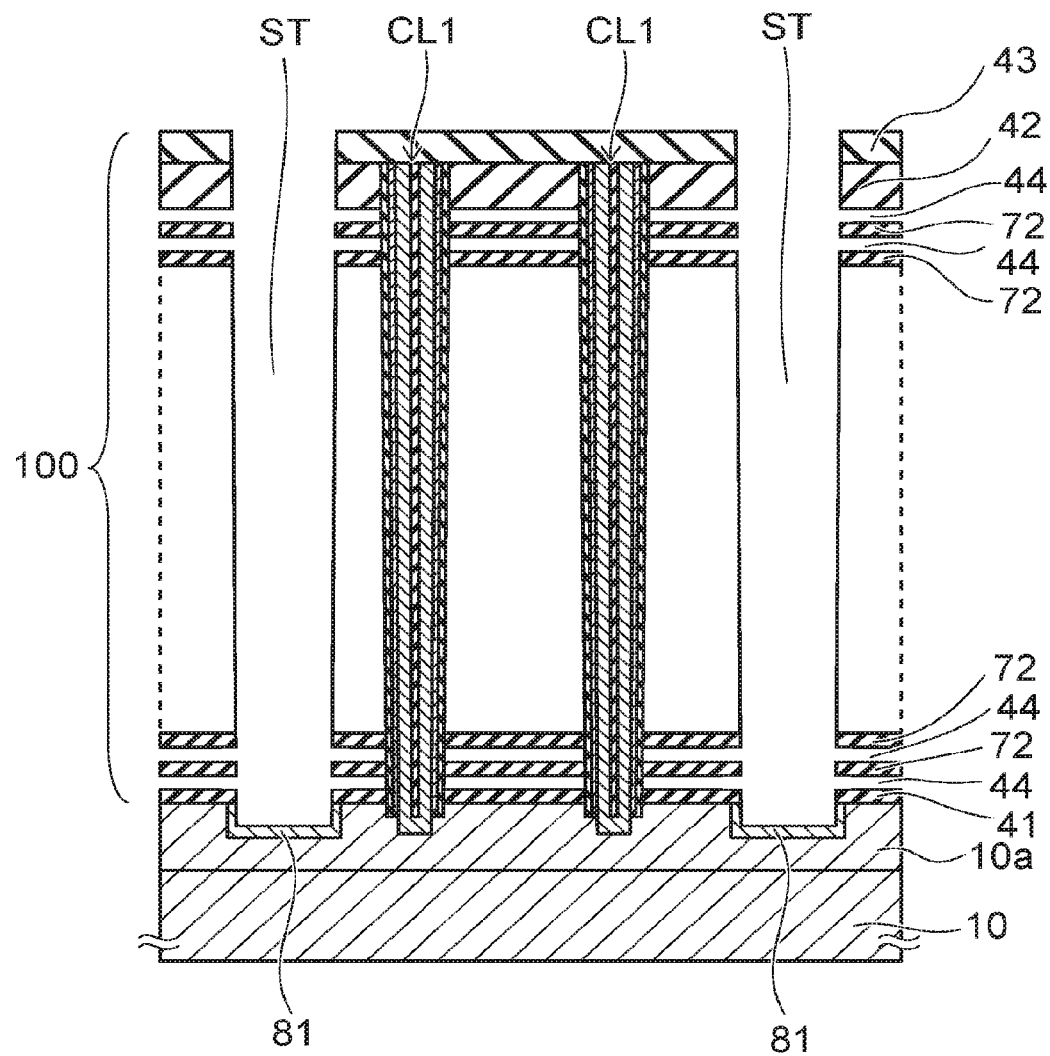

The first layers 71 are removed; and as shown in FIG. 18, a gap 44 is formed between the insulating layers 72 adjacent to each other above and below. The gap 44 is formed also between the insulating layer 41 and the lowermost second layer 72, and between the insulating layer 42 and the uppermost second layer 72.

The second layers 72 in the memory region MA contact the side surfaces of the first columnar portions CL1 to surround the side surfaces of the first columnar portions CL1. The second layers 72 are supported by such a physical bond with the first columnar portions CL1; and the gaps 44 are maintained between the insulating layers 72.

Figure 19:
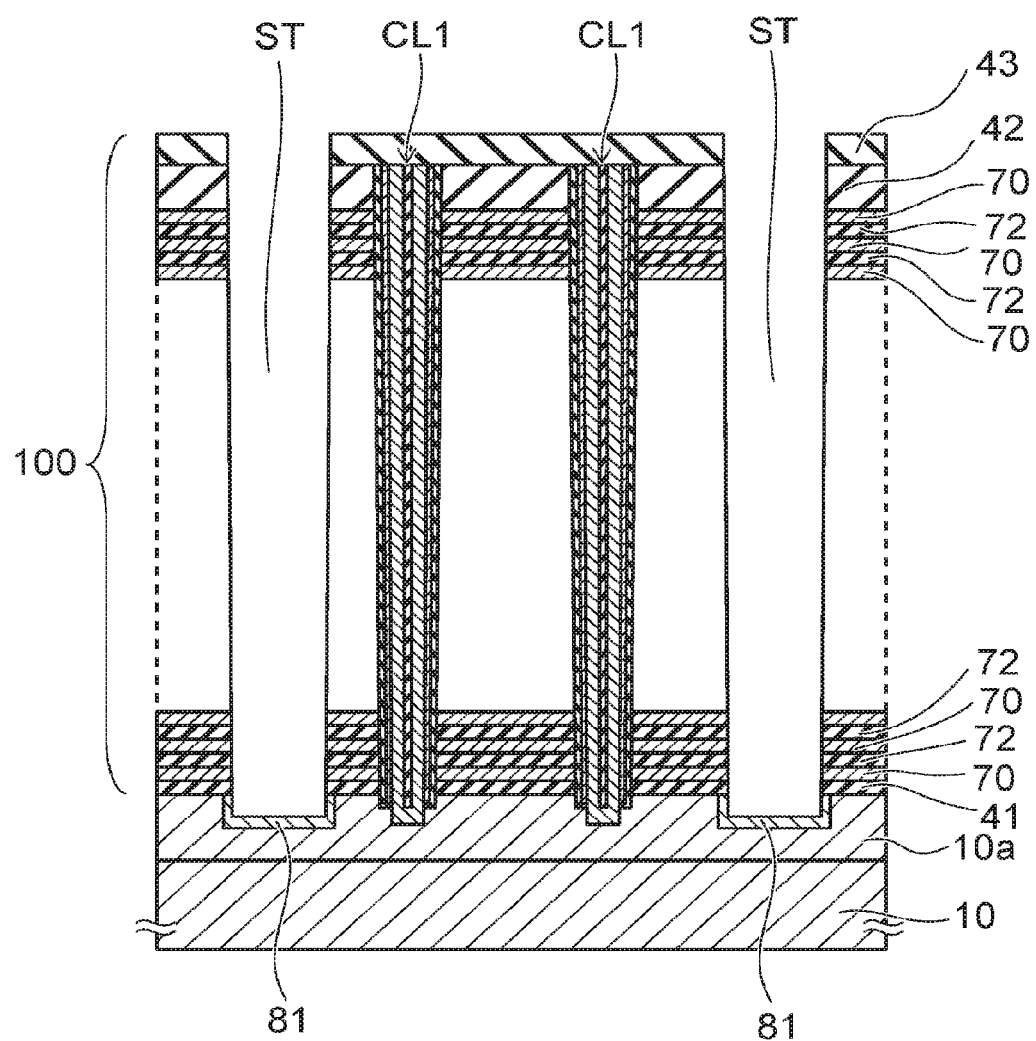

The electrode layers 70 shown in FIG. 19 are formed, with the second blocking films 35 shown in FIG. 5A interposed, in the gaps 44. For example, the second blocking films 35 and the electrode layers 70 are formed by CVD. A source gas is supplied to the gaps 44 through the slits ST. The electrode layers 70 formed on the side surfaces of the slits ST are removed.

Figure 20:
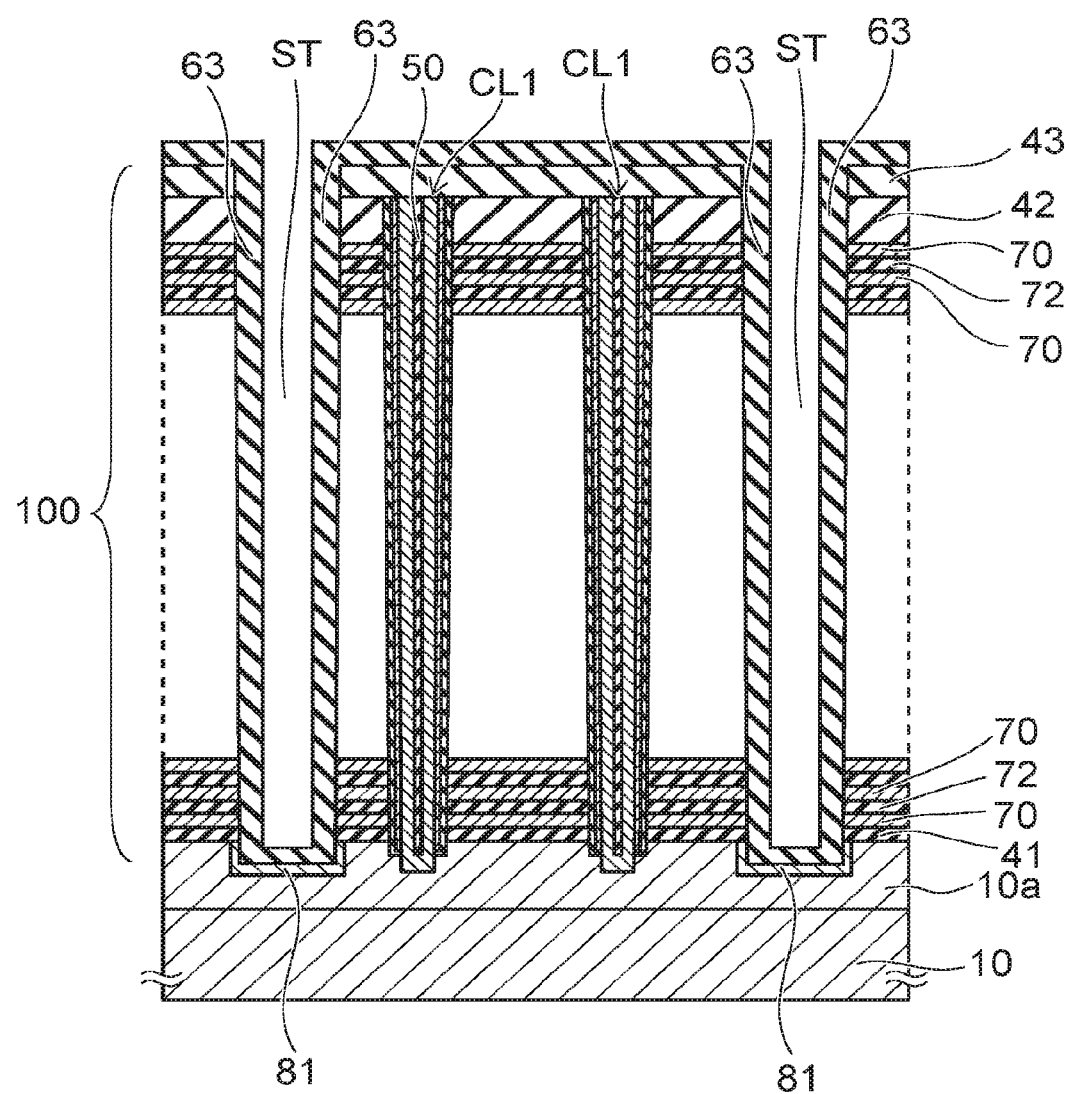
Figure 21:
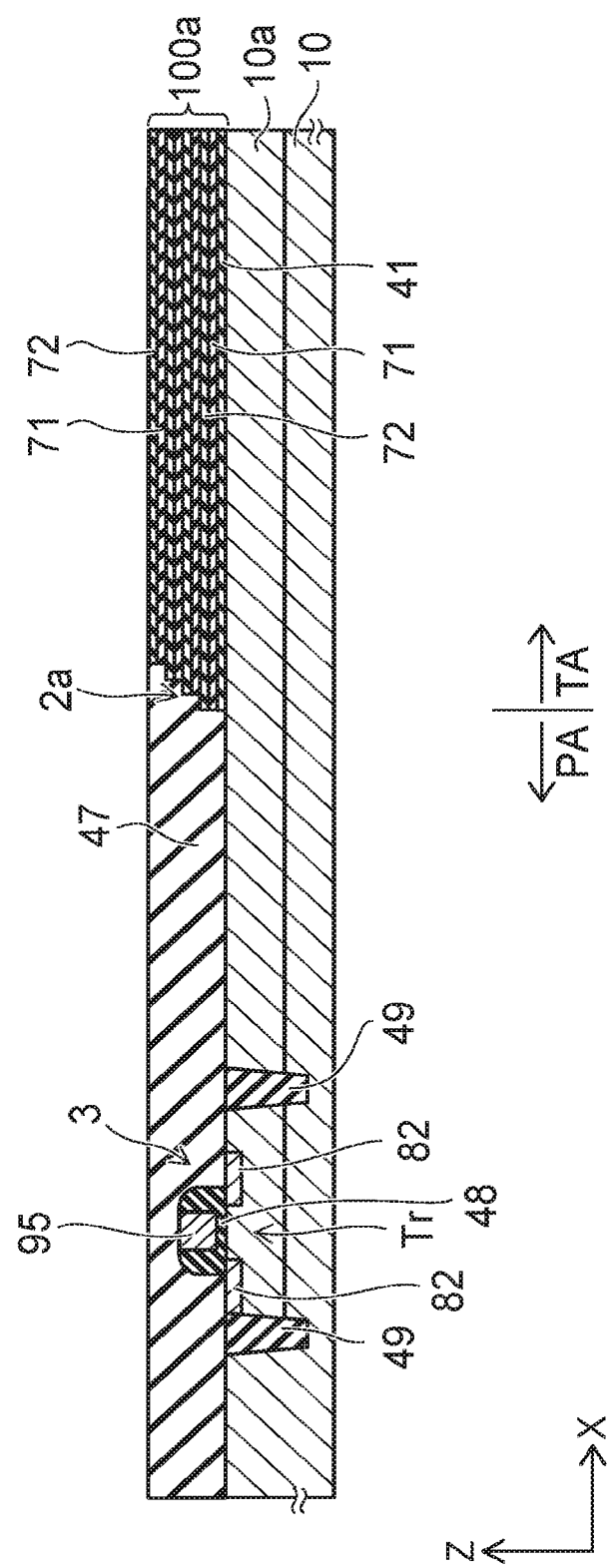

Subsequently, as shown in FIG. 20, the insulating film 63 is formed on the side surfaces and bottoms of the slits ST. After removing the insulating film 63 formed on the bottoms of the slits ST by RIE, the interconnect portion LI is filled into the inner side of the insulating film 63 inside the slits ST as shown in FIG. 4. The lower end portion of the interconnect portion LI contacts the active region 10a via the semiconductor region 81.

The processes for the terrace region TA and the peripheral region PA will now be described with reference to FIG. 21 to FIG. 30D.

The element isolation portion 49 dividing the active region 10a is formed in the surface of the substrate 10 in the peripheral region PA. The transistor Tr including the semiconductor region 82, the gate insulating film 48, and the gate electrode 95 is formed in an area separated by the element isolation portion 49. The circuit portion 3 including multiple transistors Tr is formed in the peripheral region PA. The insulating layer 47 is formed on the substrate 10 in the peripheral region PA so as to cover the circuit portion 3.

A stacked portion 100a as one portion of the first stacked portion 100 is formed on the substrate 10 in the terrace region TA and the memory region MA, with the insulating layer 41 interposed. The stacked portion 100a includes a plurality of first layers 71 and a plurality of second layers 72. The first layers 71 of the stacked portion 100a are replaced with the electrode layers 70 in a later process, and the electrode layers 70 function as the source-side selection gate of the source-side selection transistor STS.

After forming the stacked portion 100a, the stairstep portion 2a that is one portion of the stairstep portion 2 is formed in one portion of the stacked portion 100a. The one portion of the stacked portion 100a is provided in the terrace region TA. The stairstep portion 2a is covered with the insulating layer 47.

The height of the upper surface of the insulating layer 47 is substantially equal to the height of the upper surface of the stacked portion 100a.

Figure 22:
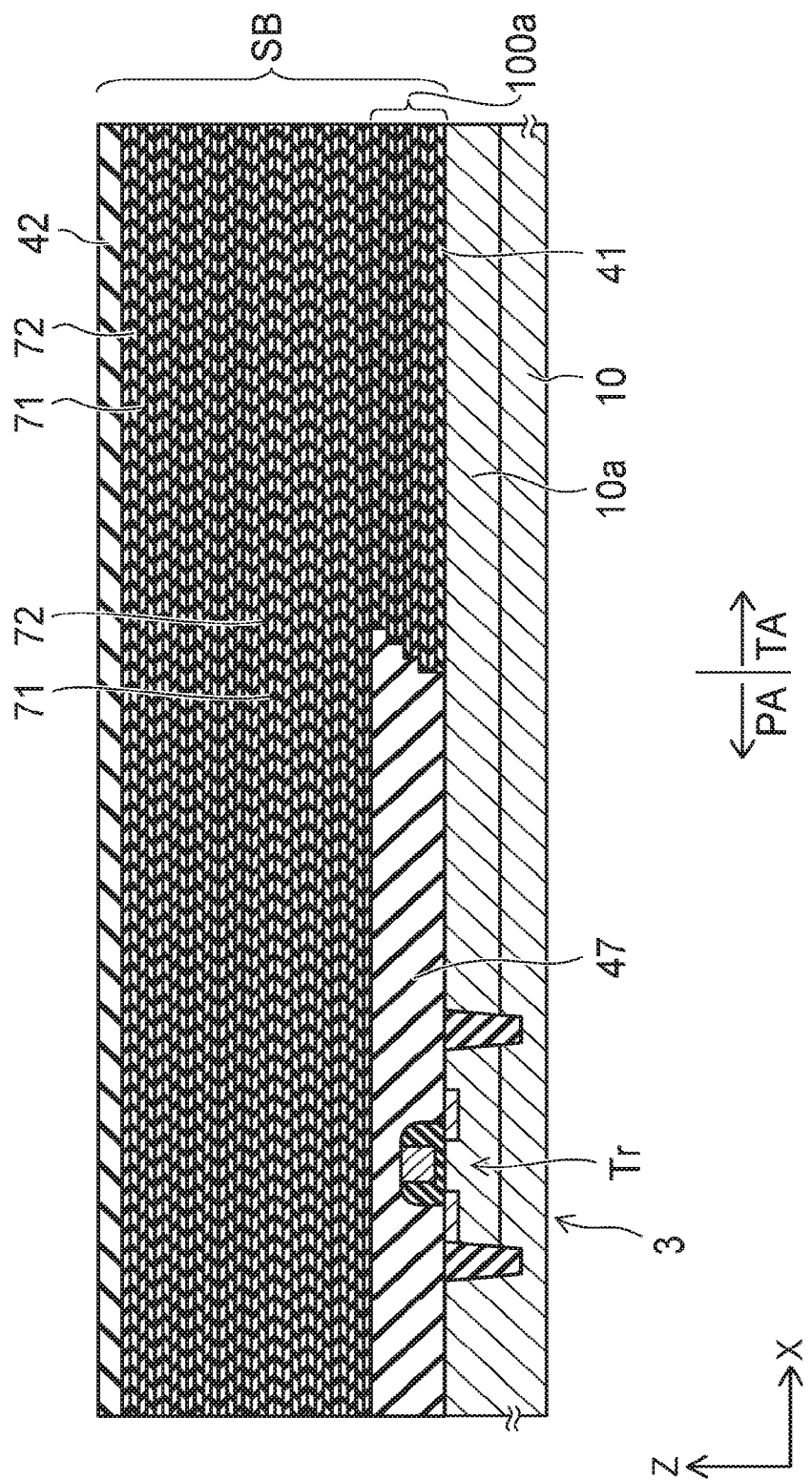

As shown in FIG. 22, the stacked body SB is formed on the insulating layer 47 and the stacked portion 100a. The upper surface of the insulating layer 47 and the upper surface of the stacked portion 100a function as an underlayer surface for the stacked body SB. The height of the underlayer surface from the surface of the substrate 10 is substantially uniform, and the underlayer surface is a flat surface.

The stacked body SB including the first layers 71 and the second layers 72 is formed continuously at the memory region MA, the terrace region TA, and the peripheral region PA.

Figure 23:
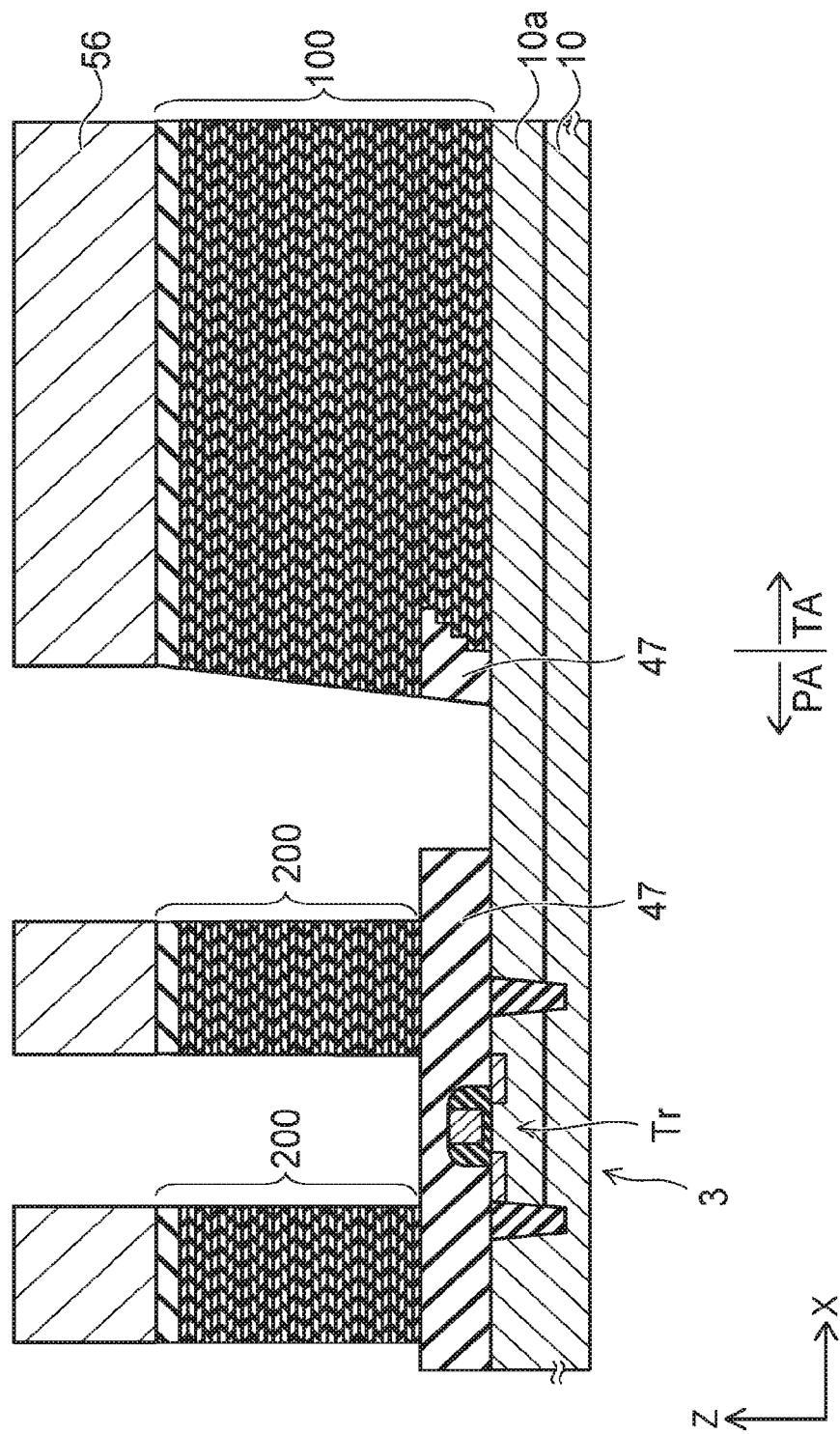

The stacked body SB is divided into the first stacked portion 100 on the memory region MA and the terrace region TA, and the second stacked portions 200 on the peripheral region PA, for example, by RIE using a mask layer 56 shown in FIG. 23.

Figure 24:
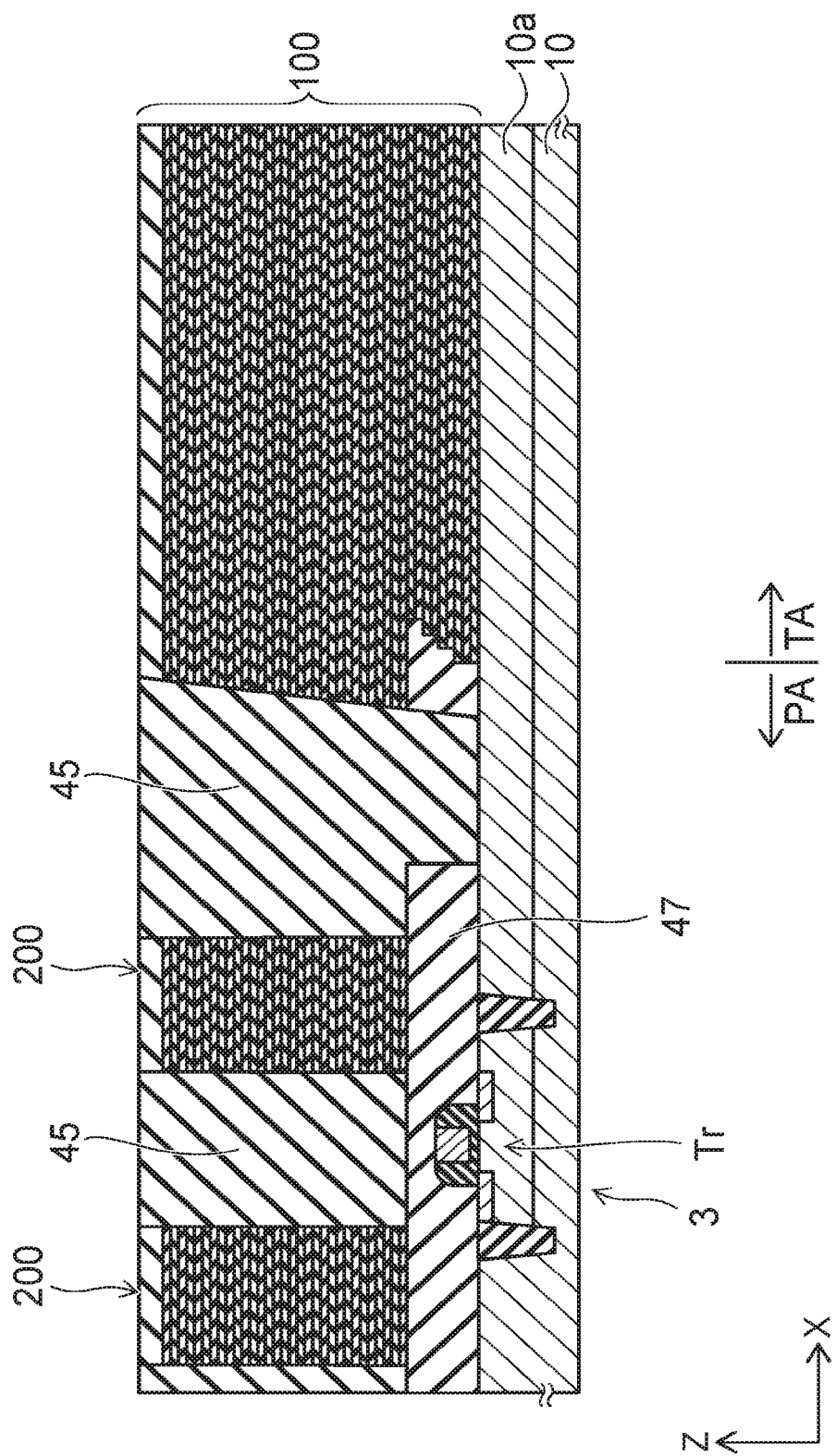

As shown in FIG. 24, the insulating layer 46 is buried in a portion in which the stacked body SB is removed.

Subsequently, as shown in FIGS. 29A to 29D, the stairstep portion 2 is formed in a portion of the first stacked portion 100. As shown in FIGS. 30A to 30D, the stairstep portion 202 is formed in a portion of the second stacked portion 200.

Figure 29A:
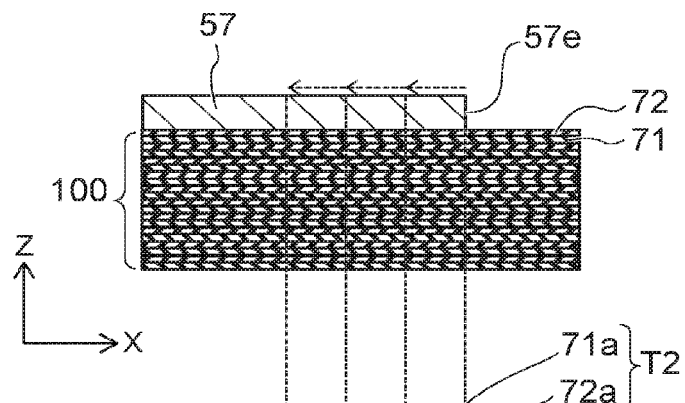

As shown in FIG. 29A, the resist film 57 is formed on the first stacked portion 100. And then the second layer 72 of the outermost surface and the first layer 71 of the next below layer in a region exposed from the resist film 57 are etched and removed.

Figure 29B:
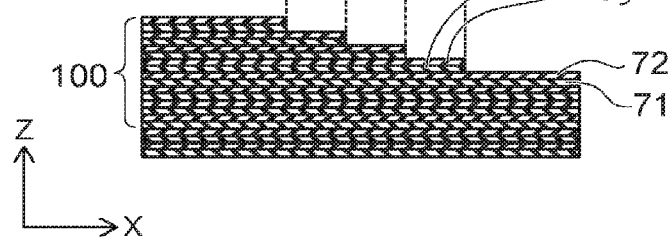

The receding (slimming) of the end 57e of the resist film 57 in the X-direction as shown by the broken line in FIG. 29A, and the etching of the second layer 72 of the outermost surface and the first layer 71 of the next below layer in the region exposed from the resist film 57 are repeated multiple times. As shown in FIG. 29B, a portion of the first stacked portion 100 is patterned in a stairstep pattern.

The resist film 57 is etched in a thickness direction with the slimming (reducing a planar size) of the resist film 57. Multiple stairstep requires the repeat of the slimming of the resist film 57 multiple times. Thus, the resist film 57 may disappear during the stairstep patterning.

Figure 29C:
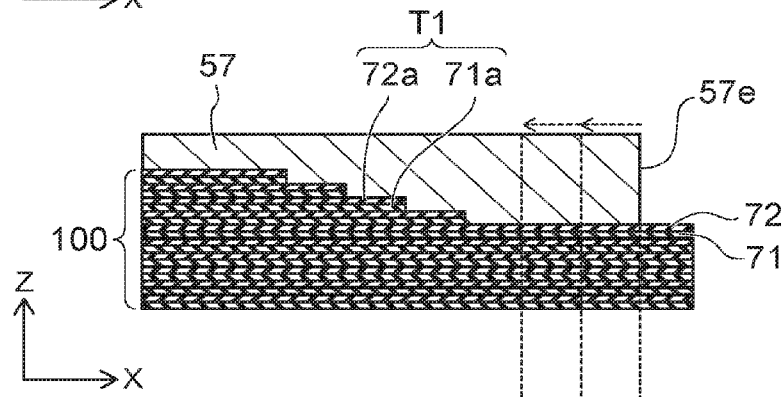

In that case, as shown in FIG. 29C, the resist film 57 is formed on the first stacked portion 100 again. The end 57e of the resist film 57 is positioned at a region not stairstep-patterned.

Figure 29D:
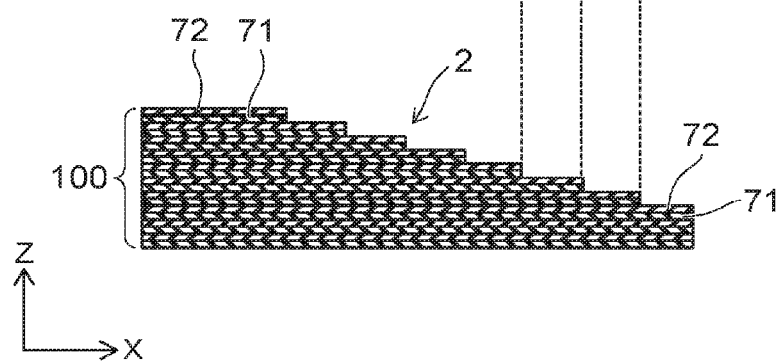

And then the etching of the second layer 72 of the outermost surface and the first layer 71 of the next below layer in the region exposed from the resist film 57, and the slimming of the resist film 57 are repeated multiple times. As shown in FIG. 29D, the stairstep portion 2 is formed in the first stacked portion 100. The processes shown in FIG. 29A to FIG. 29D may be repeated depending on the number of steps of the stairstep portion 2.

A portion of the second stacked portion 200 is patterned in a stairstep pattern by the processes shown in FIGS. 29A and 29B at the same time as forming the stairstep portion 2 in the first stacked portion 100.

Figure 30A:
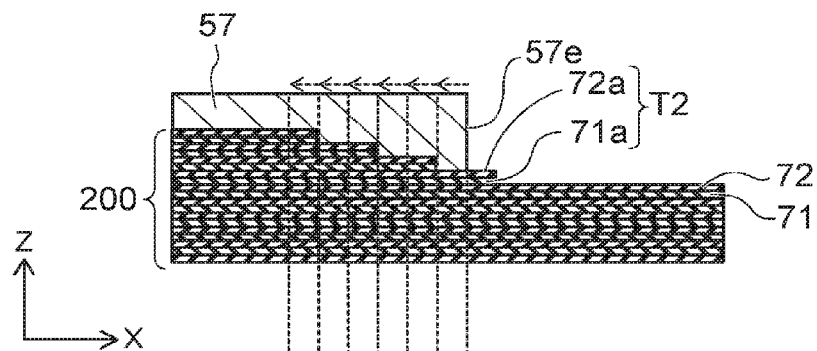

And then when the resist film 57 disappears, as shown in FIG. 30A, the resist film 57 is formed on the second stacked portion 200 again. The end 57e of the resist film 57 is positioned at the intermediate position of the width in the X-direction of the bottom stepped terrace portion T2 of the previously formed stairstep portion.

Subsequently, the etching of the second layer 72 of the outermost surface and the first layer 71 of the next below layer in the region exposed from the resist film 57, and the slimming of the resist film 57 are repeated multiple times. At this time, the receding width in the X-direction of the resist film 57 in one slimming is substantially half of the width in the X-direction of the previously formed terrace portion T2.

Figure 30B:
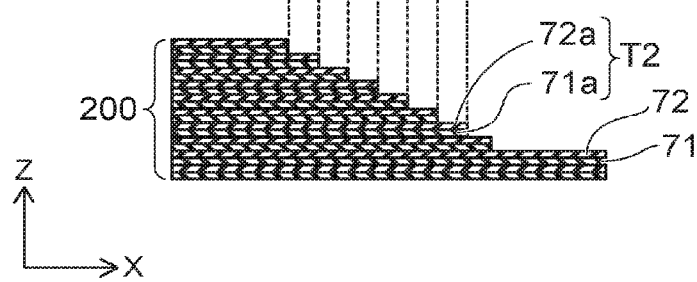

The resist film 57 is receded in the X-direction as shown by the broken line in FIG. 30A with the receding width narrower than the slimming width in one slimming of the resist film 57 formed by the preceding process. Thus, as shown in FIG. 30B, the stairstep portion that has larger steps than the stairstep portion formed by the preceding process and has narrower width in the X-direction than the stairstep portion formed by the preceding process, is formed.

Figure 30C:
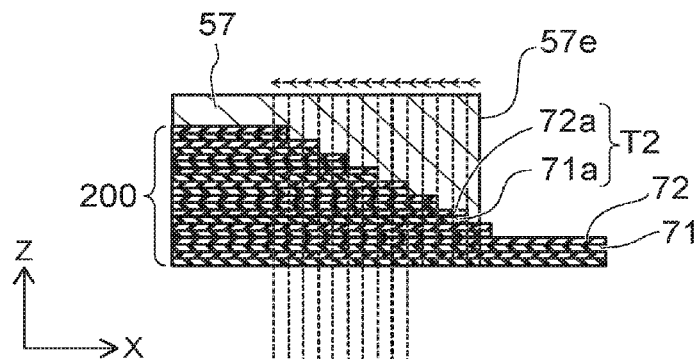

When the resist film 57 disappears again, as shown in FIG. 30C, the resist film 57 is formed on the second stacked portion 200 again. The end 57e of the resist film 57 is positioned at the intermediate position of the width in the X-direction of the bottom stepped terrace portion T2 of the previously formed stairstep portion.

Subsequently, the etching of the second layer 72 of the outermost surface and the first layer 71 of the next below layer in the region exposed from the resist film 57, and the slimming of the resist film 57 are repeated multiple times. At this time, the receding width in the X-direction of the resist film 57 in one slimming is substantially half of the width in the X-direction of the previously formed terrace portion T2.

Figure 30D:
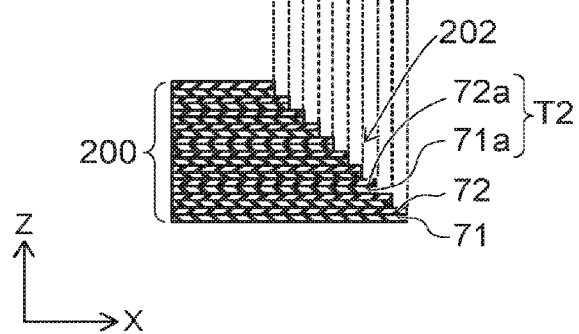

The resist film 57 is receded in the X-direction as shown by the broken line in FIG. 30C with the receding width narrower than the slimming width in one slimming of the resist film 57 formed by the preceding process. Thus, as shown in FIG. 30D, the stairstep portion 202 that has larger steps than the stairstep portion formed by the preceding process and has narrower width in the X-direction than the stairstep portion formed by the preceding process, is formed. The processes shown in FIG. 30A to FIG. 30D may be repeated depending on the number of steps of the stairstep portion 202.

In such a way, the width in the X-direction of the terrace portion T2 of the stairstep portion 202 of the second stacked portion 200 is narrower than the width in the X-direction of the terrace portion T2 of the stairstep portion 2 of the first stacked portion 100. Because a contact portion is not provided at the terrace portion T2 of the second stacked portion 200, the width of the terrace portion T2 of the second stacked portion 200 can be narrower. The narrowing of the width of the terrace portion T2 can reduce the volume loss and the width loss of the second stacked portion 200 from the second stacked portion 200 not having the stairstep portion shown in FIG. 24.

The suppression of the volume decrease of the second stacked portion 200 enhances the dispersion effect of the stress of the insulating layer 45 by the second stacked portion 200.

Figure 25:
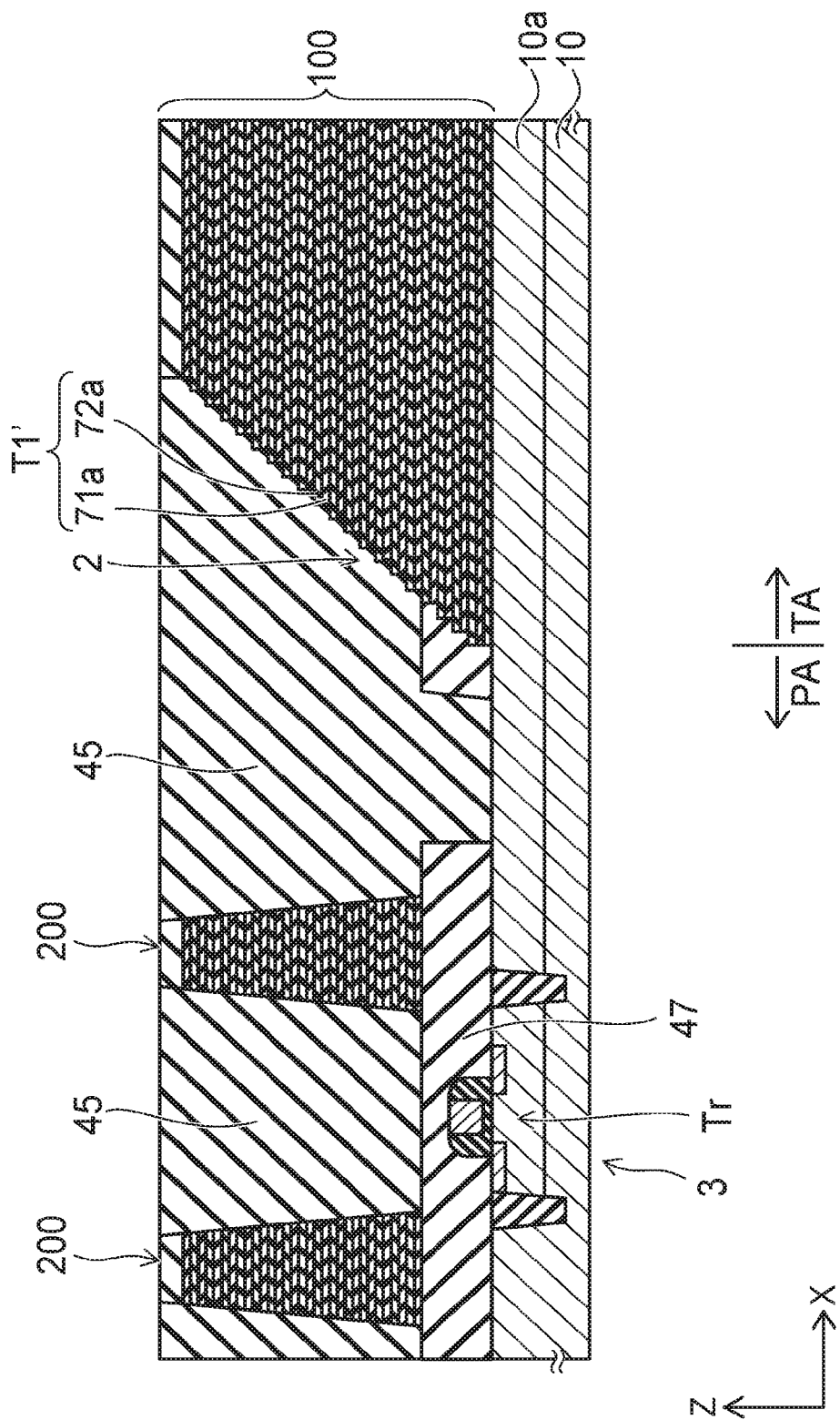

When the stairstep portion 2 and the stairstep portion 202 are formed, a portion of the insulating layer 45 shown in FIG. 24 may be etched. The insulating layer 45 shown in FIG. 25 is formed at the portion in which the insulating layer 45 is removed, on the stairstep portion 2, and on the stairstep portion 202.

The insulating layer 45 is formed so as to cover the first stacked portion 100 and the second stacked portion 200. And then the upper surface of the insulating layer 45 is planarized. The height of the upper surface of the insulating layer 45 is substantially equal to the height of the upper surface of the first stacked portion 100 and the height of the upper surface of the second stacked portion 200.

After forming the insulating layer 45, the first columnar portions CL1 are formed in the first stacked portion 100 in the memory region MA and the second columnar portions CL2 are formed in the first stacked portion 100 in the terrace region TA. The first columnar portions CL1 and the second columnar portions CL2 are formed simultaneously, for example.

Subsequently, the slit ST is formed in the first stacked portion 100, and in the insulating layer 45 on the stairstep portion 2.

After forming the slit ST, as described above, the first layers 71 of the first stacked portion 100 are removed by for example an etchant including phosphoric acid supplied through the slit ST. The first layers 71 are removed; and as shown in FIG. 26, the gaps 44 are formed in the first stacked portion 100.

Figure 26:
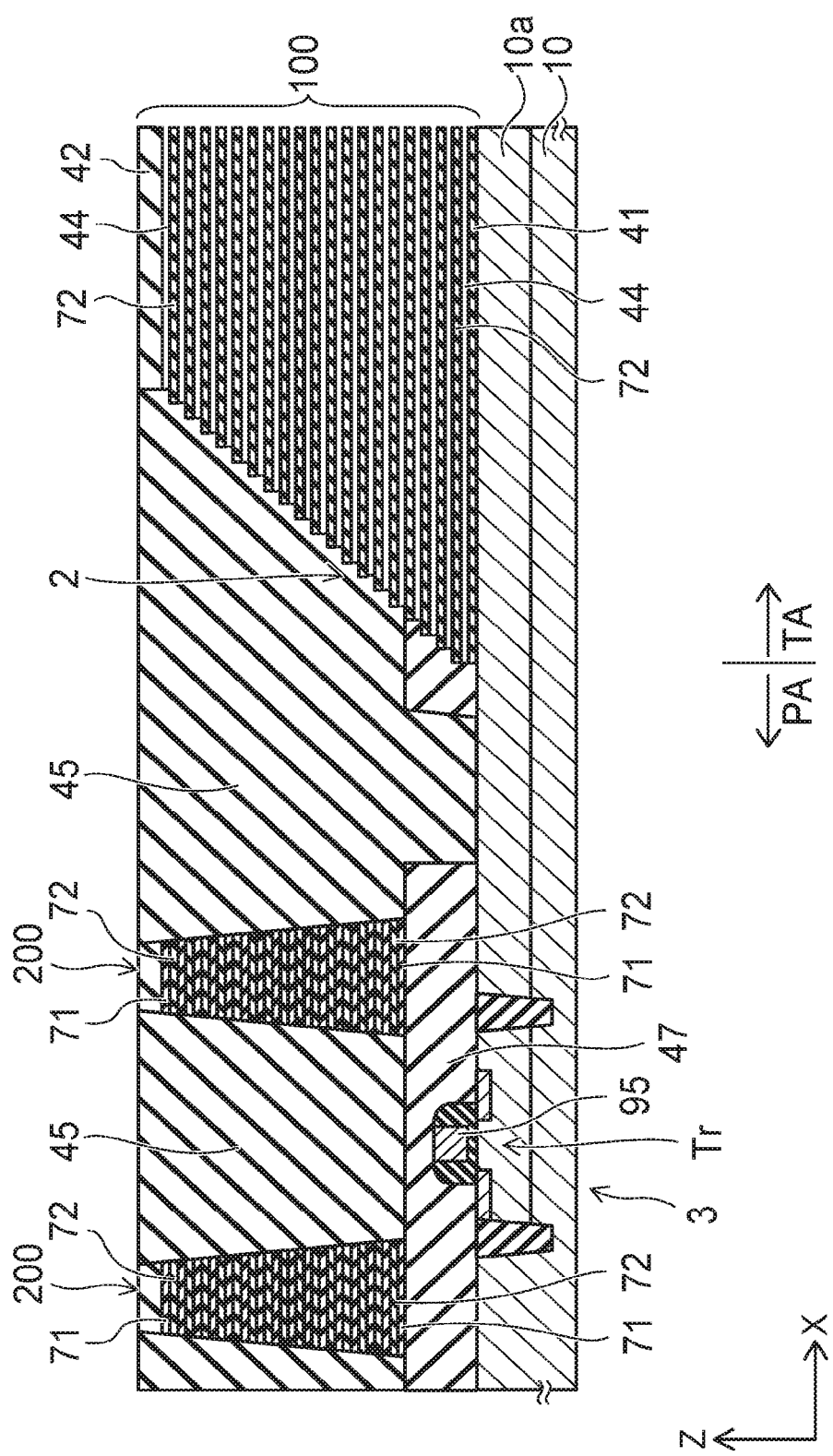

The second layers 72 in the terrace region TA contact the side surfaces of the second columnar portions CL2 shown in FIG. 26 to surround the side surfaces of the second columnar portions CL2. The second layers 72 are supported by such a physical bond with the second columnar portions CL2; and the gaps 44 are maintained between the insulating layers 72.

The slit is not formed in the second stacked portion 200 in the peripheral region PA. The first layers 71 in the second stacked portion 200 are not replaced with the electrode layers and remain in the second stacked portion 200. The memory cell and the transistor are not provided in the second stacked portion 200. The electrode layers functioning as control gates of the memory cell and the transistor may not be provided in the second stacked portion 200.

If the first layers 71 in the second stacked portion 200 are removed, columnar portions may be provided through the second stacked portion 200 in the stacking direction for temporarily support the second stacked portion 200 including the gaps 44. As shown previously in FIG. 9, it is difficult to secure a space margin for disposing such columnar portions in the second stacked portion 200 disposed at restricted and narrower area so as not to overlap the contact portions 96 and 97 of the transistor Tr.

Figure 27:
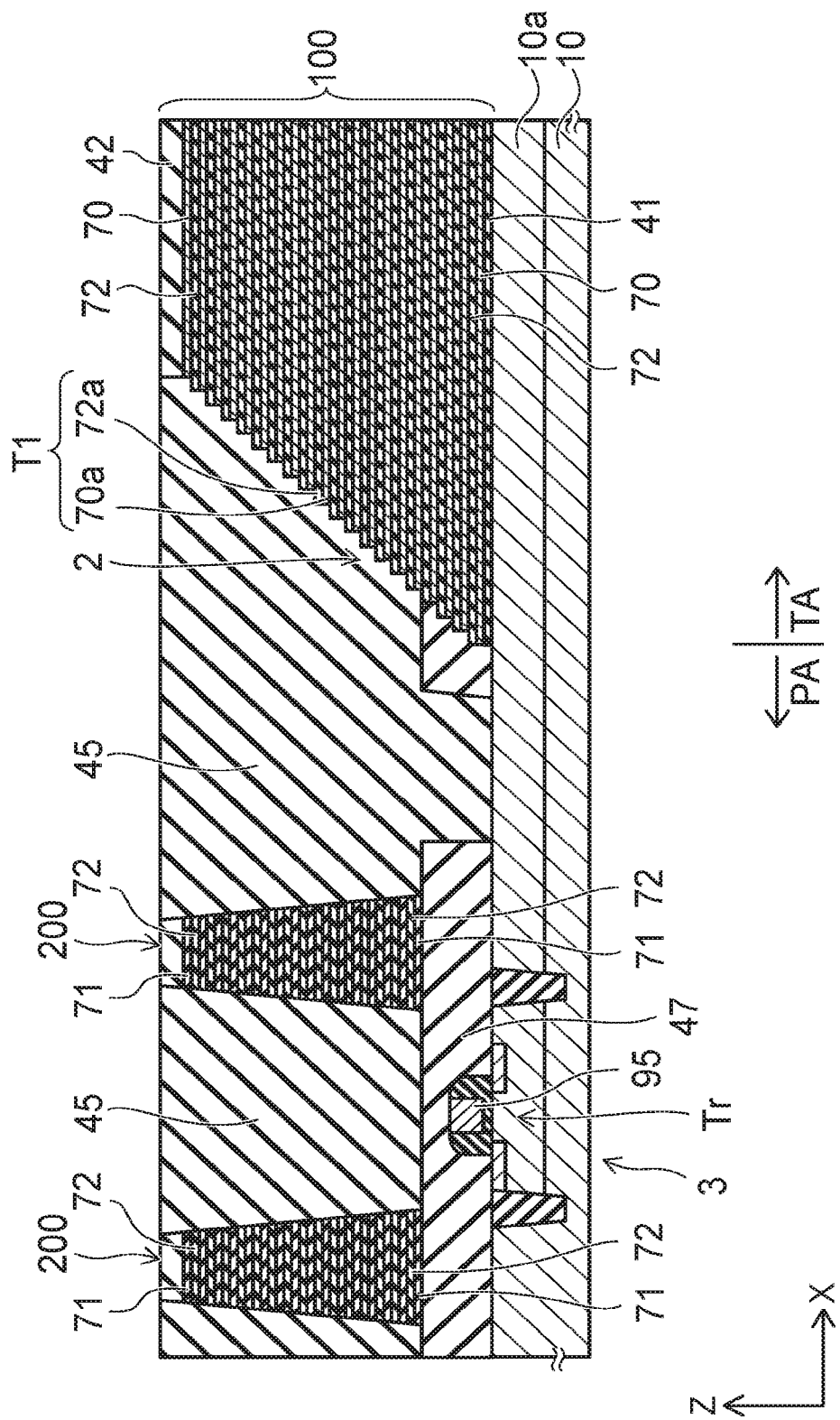

The electrode layers 70, as shown in FIG. 27, are formed in the gaps 44 of the first stacked portion 100. And then the interconnect portion LI is formed in the slit ST with the insulating film 63 interposed.

Figure 28:
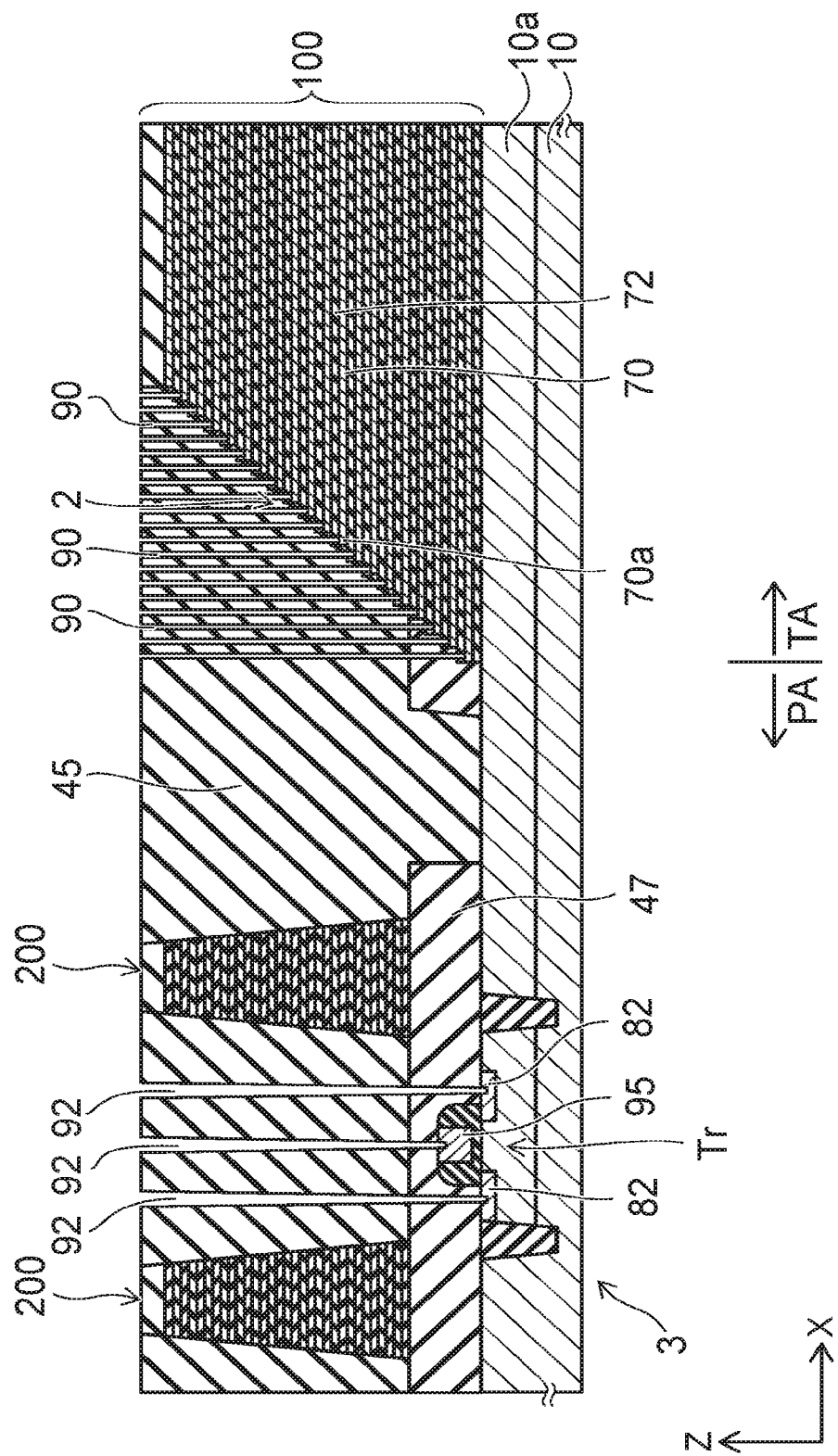

Subsequently, as shown in FIG. 28, a plurality of contact holes 90 are formed in the insulating layer 45 on the stairstep portion 2. The contact holes 90 extend in the Z-direction through the insulating layer 45, and reach the terrace portions 70a of the electrode layers 70.

As shown in FIG. 7, a conductive material including metal is filled in the contact hole 90. Thus, a contact portion 91 is formed in the contact hole 90.

As shown in FIG. 28, a plurality of contact holes 92 are formed in the insulating layer 45 on the circuit portion 3. The contact holes 92 extend in the Z-direction through the insulating layer 45, and reach the semiconductor region 82 and the gate electrode 95 of the transistor Tr. Because the second stacked portion 200 is not disposed at a position (an area) in which the contact hole 92 is formed, the second stacked portion 200 does not prevent the contact hole 92 from being formed.

As shown in FIG. 7, a conductive material including metal is filled in the contact hole 92. Thus, an electrode 93 is formed in the contact hole 92.

The contact hole 90 and the contact hole 92 are formed by RIE using a mask layer. The mask layer includes a resist film having hole patterns formed by lithography. For example, the mask layer includes an intermediate film formed below the resist film and a hard mask layer formed below the intermediate film other than the resist film.

The contact hole 90 and the contact hole 92 may be simultaneously formed. Or, the contact hole 90 and the contact hole 92 may be formed by separate steps.

If the second stacked portion 200 is not provided (left) in the peripheral region PA, difference in height of the underlayer before forming the insulating layer 45 in FIG. 25 may be produced due to the presence or absence of the first stacked portion 100. This makes it easier to form a step on the upper surface of insulating layer 45. The upper surface of insulating layer 45 in the peripheral region PA is lower than the upper surface of insulating layer 45 in the area including the first stacked portion 100. A step is formed also on the resist film formed on the insulating layer 45 having the step. If the resist film has a step beyond tolerance of lithography margin, the accuracy of the hole pattern may decrease.

According to the embodiment, prior to form the insulating layer 45, as shown in FIG. 23, the second stacked portion 200 having about the same height as the first stacked portion 100 remains in the peripheral region PA. Thus, the insulating layer 45 can be formed later with a step of the upper surface of the insulating layer 45 reduced or eliminated. This secures flatness of the resist film formed on the insulating layer 45 later, and increases pattern accuracy by lithography.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a substrate:
   a first stacked portion provided above the substrate, the first stacked portion including a plurality of electrode layers stacked with an insulator interposed,
   a semiconductor body extending through the first stacked portion in a stacking direction of the first stacked portion;
   a charge storage portion provided between the semiconductor body and one of the electrode layers;
   a circuit portion including a transistor provided at a region separated from the first stacked portion in the substrate;
   a second stacked portion provided above the circuit portion, the second stacked portion including a plurality of first layers and a plurality of second layers, the first layers and the second layers including a first layer and a second layer stacked alternately; and
   an insulating layer provided above the circuit portion and provided above the substrate between the first stacked portion and the second stacked portion;
   a height of an uppermost first layer of the second stacked portion from a surface of the substrate being substantially equal to a height of an uppermost electrode layer of the first stacked portion from the surface of the substrate, or being higher than the height of the uppermost electrode layer;
   wherein a height of a lowermost electrode layer of the first stacked portion from the surface of the substrate is lower than a height of a lowermost first layer of the second stacked portion from the surface of the substrate.

2. The device according to claim 1, wherein number of the electrode layers of the first stacked portion is greater than number of the first layers of the second stacked portion.

3. The device according to claim 1, further comprising an electrode extending through the insulating layer in the stacking direction and connected to the transistor of the circuit portion, the second stacked portion being disposed at a region not overlapping the electrode.

4. The device according to claim 1, wherein the insulator of the first stacked portion is an insulating layer made of a same material as the second layer of the second stacked portion.

5. The device according to claim 1, wherein the electrode layers of the first stacked portion are metal layers, and the first layers of the second stacked portion are silicon nitride layers.

6. The device according to claim 1, wherein
   the electrode layers of the first stacked portion include a plurality of first terrace portions arranged in a first direction in a stairstep configuration with a difference in levels,
   the insulating layer covers the first terrace portions, and
   a plurality of contact electrodes extend through the insulating layer in the stacking direction and connect to the first terrace portions.

7. The device according to claim 1, further comprising a separation portion dividing the first stacked portion into a plurality of blocks.

8. The device according to claim 6, wherein the first terrace portions are provided between a region in which the circuit portion and the second stacked portion are disposed, and a region in which the semiconductor body and the charge storage portion are disposed.

9. The device according to claim 6, wherein
   the second stacked portion include a plurality of second terrace portions arranged in the first direction in a stairstep configuration with a difference in levels, and
   widths in the first direction of the second terrace portions of the second stacked portion are narrower than widths in the first direction of the first terrace portions of the first stacked portion.

10. The device according to claim 6, further comprising a columnar portion extending through the insulating layer and the first stacked portion below the insulating layer in the stacking direction.

11. The device according to claim 7, wherein the separation portion includes an interconnect portion contacting the substrate.

* * * * *